(12) United States Patent
Mori et al.

(10) Patent No.: US 8,034,178 B2
(45) Date of Patent: Oct. 11, 2011

(54) APPARATUS AND METHOD FOR MANUFACTURING AN ORGANIC ELECTROLUMINESCENCE DISPLAY

(75) Inventors: Takao Mori, Kanagawa (JP); Masaru Yamaguchi, Kanagawa (JP); Isao Kamiyama, Tokyo (JP)

(73) Assignee: Sony Corporation, Tokyo (JP)

( * ) Notice: Subject to any disclaimer, the term of this patent is extended or adjusted under 35 U.S.C. 154(b) by 798 days.

(21) Appl. No.: 10/796,527

(22) Filed: Mar. 9, 2004

(65) Prior Publication Data

US 2004/0168634 A1    Sep. 2, 2004

Related U.S. Application Data

(62) Division of application No. 10/153,453, filed on May 21, 2002.

(30) Foreign Application Priority Data

Jun. 12, 2001   (JP) ................. P2001-177682

(51) Int. Cl.
*C23C 16/00* (2006.01)
*C23C 16/04* (2006.01)

(52) U.S. Cl. ......... 118/719; 118/720; 118/721; 118/715

(58) Field of Classification Search .......... 118/718–721, 118/715; 156/345.31, 345.32, 345.51, 345.52
See application file for complete search history.

(56) References Cited

U.S. PATENT DOCUMENTS

| | | | | |
|---|---|---|---|---|
| 4,425,871 A | * | 1/1984 | Martin | 118/664 |
| 4,492,180 A | * | 1/1985 | Martin | 118/704 |
| 4,511,599 A | | 4/1985 | Rustomji | |
| 4,917,556 A | * | 4/1990 | Stark et al. | 414/217 |
| 5,259,881 A | * | 11/1993 | Edwards et al. | 118/719 |
| 5,310,410 A | * | 5/1994 | Begin et al. | 29/25.01 |
| 5,451,261 A | * | 9/1995 | Fujii et al. | 118/728 |
| 5,695,564 A | * | 12/1997 | Imahashi | 118/719 |
| 5,701,055 A | | 12/1997 | Nagayama et al. | |
| 5,769,952 A | * | 6/1998 | Komino | 118/733 |
| 5,817,366 A | | 10/1998 | Arai et al. | |
| 5,820,679 A | * | 10/1998 | Yokoyama et al. | 118/719 |
| 5,904,961 A | | 5/1999 | Tang et al. | |

(Continued)

FOREIGN PATENT DOCUMENTS

EP    0 987 700    3/2000

(Continued)

OTHER PUBLICATIONS

Office Action dated Dec. 14, 2006 of parent U.S. Appl. No. 10/153,543, filed May 21, 2002.

(Continued)

*Primary Examiner* — Jeffrie R Lund
(74) *Attorney, Agent, or Firm* — K&L Gates LLP

(57) ABSTRACT

An apparatus for manufacturing an organic electroluminescence display having an alignment chamber for aligning a mask having openings corresponding to a predetermined pattern with a substrate on which a first electrode layer is formed and detachably attaching the mask and the substrate. The apparatus further including a number of vacuum processing chambers for sequentially forming a number of organic material layers on the substrate attached with the mask. The apparatus also including a transfer robot for transferring the attached mask and substrate to one of the number of vacuum processing chambers and sequentially transferring it between the number of the vacuum processing chambers.

15 Claims, 22 Drawing Sheets

U.S. PATENT DOCUMENTS

| | | | |
|---|---|---|---|
| 6,099,598 A * | 8/2000 | Yokoyama et al. | 29/25.01 |
| 6,132,280 A * | 10/2000 | Tanabe et al. | 445/58 |
| 6,143,083 A * | 11/2000 | Yonemitsu et al. | 118/719 |
| 6,179,923 B1 | 1/2001 | Yamamoto et al. | |
| 6,214,631 B1 * | 4/2001 | Burrows et al. | 438/22 |
| 6,503,365 B1 * | 1/2003 | Kim et al. | 156/345.32 |
| 6,589,382 B2 * | 7/2003 | Clark et al. | 156/304.3 |
| 6,776,880 B1 * | 8/2004 | Yamazaki | 204/192.15 |
| 6,821,348 B2 * | 11/2004 | Baude et al. | 118/720 |
| 6,930,050 B2 * | 8/2005 | Kim et al. | 438/716 |
| 2001/0006827 A1 * | 7/2001 | Yamazaki et al. | 438/30 |
| 2001/0055844 A1 | 12/2001 | Yamada | |
| 2002/0011972 A1 | 1/2002 | Yamazaki et al. | |
| 2002/0030443 A1 | 3/2002 | Konuma et al. | |
| 2002/0139303 A1 * | 10/2002 | Yamazaki et al. | 118/719 |
| 2002/0155632 A1 * | 10/2002 | Yamazaki et al. | 438/29 |
| 2002/0187265 A1 * | 12/2002 | Mori et al. | 427/282 |
| 2004/0168634 A1 * | 9/2004 | Mori et al. | 118/719 |
| 2005/0005850 A1 * | 1/2005 | Yamazaki | 118/719 |

FOREIGN PATENT DOCUMENTS

| | | |
|---|---|---|
| EP | 1035576 A2 * | 9/2000 |
| EP | 1 115 268 | 7/2001 |
| JP | 60208756 | 10/1985 |
| JP | 08-111285 | 4/1996 |
| JP | 10-214682 * | 11/1998 |
| JP | 1998-214682 | 11/1998 |
| JP | 10214682 A * | 11/1998 |
| JP | 2001-089841 | 3/2001 |
| WO | 01/05194 | 1/2001 |

OTHER PUBLICATIONS

Office Action dated May 21, 2007 of parent U.S. Appl. No. 10/153,543, filed May 21, 2002.

* cited by examiner

APPARATUS AND METHOD FOR MANUFACTURING AN ORGANIC ELECTROLUMINESCENCE DISPLAY

CROSS REFERENCE TO RELATED APPLICATIONS

This patent application is a divisional of U.S. application Ser. No. 10/153,453, filed on May 21, 2002, the disclosure of which is herein incorporated by reference.

BACKGROUND OF THE INVENTION

The present invention relates to both a manufacturing apparatus for an organic electroluminescence display and a method of manufacturing an organic electroluminescence display.

An organic electroluminescence element is structured by an organic layer including an organic material sandwiched between electrodes made of an anode and a cathode. It is known that when voltage is applied across these electrodes, electrons and holes are injected from the cathode and anode into the organic layer of the organic electroluminescence element. These electrons and holes recombine to emit light.

In such an organic electroluminescence element, a luminescence of, for example, several hundreds to several tens of thousands of cd/m2 is obtained with a driving voltage of less than 10V. Further, the organic electroluminescence element can emit light having a suitable color by suitable selection of the luminous material, that is, the fluorescent material. Thus, a display using organic electroluminescence elements promises a multi-colored or full-colored display that may take the place of a cathode ray tube (CRT) display.

As the above described organic layer, an organic layer made of three to five stacked organic material layers such as a hole injection layer, a hole transfer layer, a light emitting layer, and an electric charge injection layer is known. Each of the organic material layers is formed by vapor deposition of the organic material in a processing chamber.

Each organic material layer may be vapor deposited in the same processing chamber. Specifically, vapor deposition includes aligning a mask arranged in a processing chamber and having openings corresponding to the pixels of a display with a substrate loaded into the processing chamber, inserting different vapor deposition materials in a number of heating vessels arranged in the processing chamber corresponding to the organic material layers, and heating these to cause the evaporation of the materials.

However, when forming an organic layer having a number of organic material layers in the same processing chamber, as described above, there are disadvantages in that a cycle time of the process for forming the organic layer can become extremely long. Thus, mass production of such a display using organic electroluminescence elements can be difficult.

When forming an organic layer having a number of organic material layers in the same processing chamber, it is necessary to heat each vapor deposition material for each vapor deposition. A relatively long time is needed until reaching the desired temperature and a relatively long time is needed until an evaporation rate of a vapor deposition source becomes stable. Thus, the waiting time before starting vapor deposition for each organic material layer is extended. As a result, it takes an extremely long time to form an organic layer.

Conversely, by heating the vapor deposition materials to a predetermined temperature at all times to stabilize the evaporation rate, it becomes possible to shorten the waiting time before starting the vapor deposition for each organic material layer. However, while vapor depositing an organic material layer corresponding to one vapor deposition source, vapor deposition materials are also evaporated from other vapor deposition sources. Thus, wasteful consumption of materials is hard to avoid. The organic materials used for an organic electroluminescence element are very costly, so the production cost of the organic layer swells and, as a result, the mass production of a display using organic electroluminescence elements becomes difficult.

A technique for eliminating some of the disadvantages caused by forming an organic layer in the same processing chamber is disclosed, for example, in Japanese Unexamined Patent Publication (Kokai) No. 8-111285.

The above publication discloses a technique of arranging processing chambers for vapor deposition of the different organic material layers around a vacuum chamber and transferring a substrate between the processing chambers through the vacuum chamber. By dispersing the vapor deposition of the organic material layers to different processing chambers, it becomes possible to greatly shorten the waiting time for heating the vapor deposition sources and stabilizing the evaporation rate.

However, if dispersing the vapor deposition of the organic material layers to different processing chambers, alignment work between the substrate and mask becomes necessary in each processing chamber. As a result, it is very difficult to sufficiently shorten the cycle time of the process for forming an organic layer. Further, during the alignment work, the vapor deposition materials can be wasted.

SUMMARY OF THE INVENTION

An advantage of the present invention is, therefore, to provide an apparatus for manufacturing an organic electroluminescence display that is capable of shortening a cycle time of a process for forming an organic layer of an organic electroluminescence display and that is capable of suppressing wasteful consumption of organic materials used for forming the organic layer.

Another advantage of the present invention is to provide a method of manufacturing an organic electroluminescence display that is capable of shortening a cycle time of a process for forming an organic layer of an organic electroluminescence display and that is capable of suppressing wasteful consumption of organic materials used for forming the organic layer.

According to an embodiment of the present invention, a method of manufacturing an organic electroluminescence display is provided. The organic electroluminescence display has a substrate, a first electrode layer formed on the substrate with a predetermined pattern, an organic layer including a number of organic material layers stacked on the first electrode layer with a predetermined pattern, and a second electrode layer formed on the organic layer. The method includes aligning a mask having openings corresponding to the predetermined pattern with the substrate on which the first electrode layer is formed, detachably attaching the mask and the substrate, sequentially forming a number of organic material layers on the substrate attached with the mask in a number of vacuum processing chambers, and transferring the mask and the substrate between the vacuum processing chambers in an attached state.

According to another embodiment of the present invention, an apparatus for manufacturing an organic electroluminescence display is provided. The organic electroluminescence display has a substrate, a first electrode layer formed on the substrate with a predetermined pattern, an organic layer including a number of organic material layers stacked on the first electrode layer, with a predetermined pattern, and a second electrode layer formed on the organic layer. The apparatus includes an alignment mechanism for aligning a mask having openings corresponding to the predetermined pattern with the substrate on which the first electrode layer is formed and detachably attaching the mask and the substrate, a number of vacuum processing chambers for sequentially forming a number of the organic material layers on the substrate attached with the mask, and a transferring mechanism for transferring the attached mask and substrate to one of a number of the vacuum chambers and sequentially transferring it among the number of the vacuum processing chambers.

In an embodiment according to the present invention, when the mask and the substrate are aligned and attached, the two are loaded into one of the number of vacuum processing chambers in an attached state. The vacuum processing apparatus into which the mask and substrate are loaded is capable of forming at least one layer of the number of organic material layers producing the organic layer. The organic material layer is formed after the loading is completed.

After forming the at least one of the organic material layers, the attached mask and the substrate are unloaded from the vacuum processing apparatus and then loaded into another vacuum processing apparatus so that another organic material layer may be stacked. The same process of formation of the organic material layer and the same transfer of the mask and the substrate are repeated until the organic layer is formed.

As a result, according to an embodiment of the present invention, the formation of the number of organic layers producing the organic layer is divided among the number of vacuum processing apparatuses and the transfer of the substrate between the number of vacuum processing apparatuses is performed in a state with the mask and the substrate attached. As a result, alignment between the mask and the substrate is not needed and the time for alignment can be eliminated.

Additional features and advantages of the present invention are described in, and will be apparent from, the following Detailed Description of the Invention and the Figures.

DETAILED DESCRIPTION OF THE INVENTION

Figure 1:
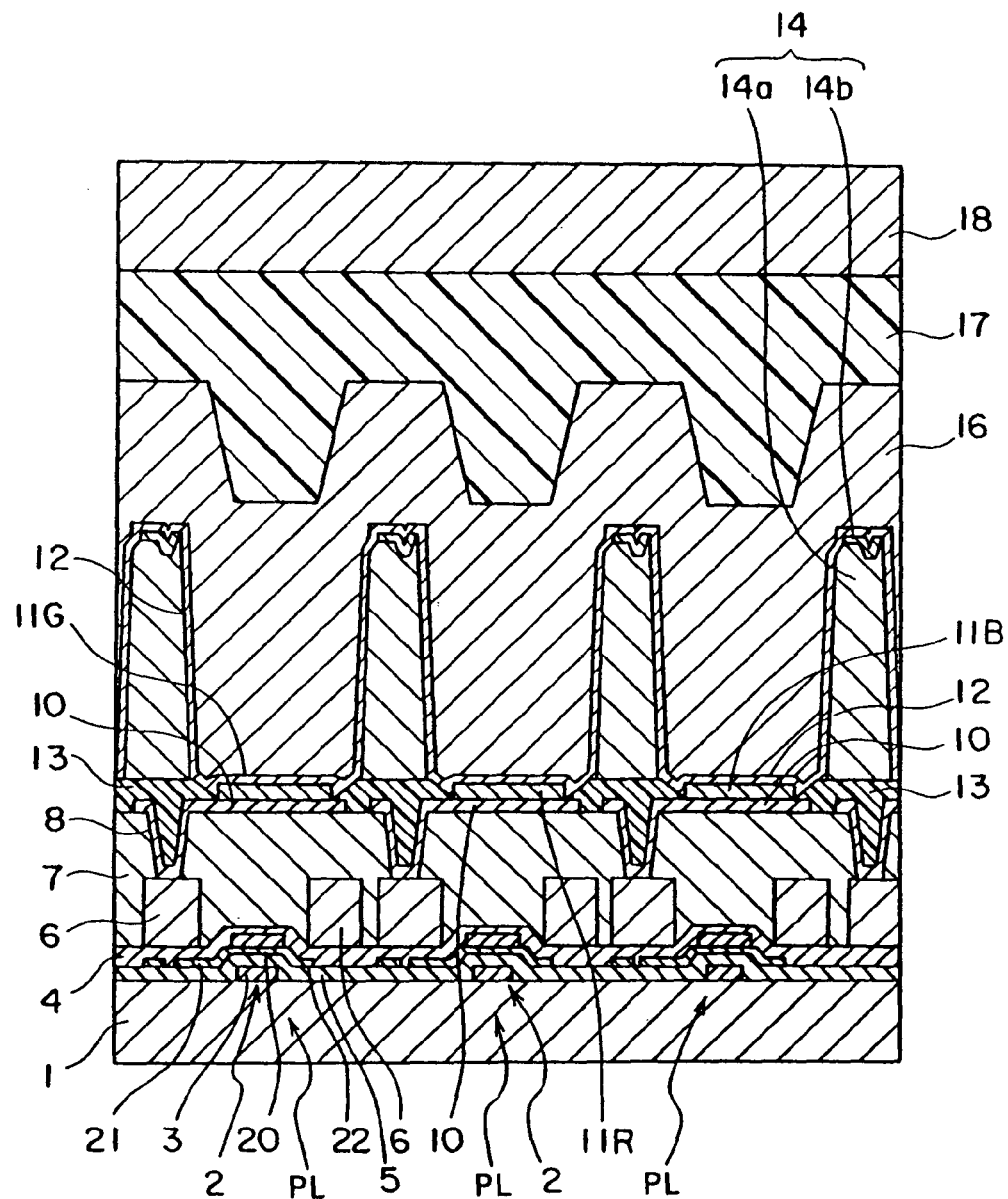
FIG. 1 is a cross-sectional view of an embodiment of an organic electroluminescence display according to the present invention showing a portion of a general configuration of a display area of the organic electroluminescence display.
Figure 2:
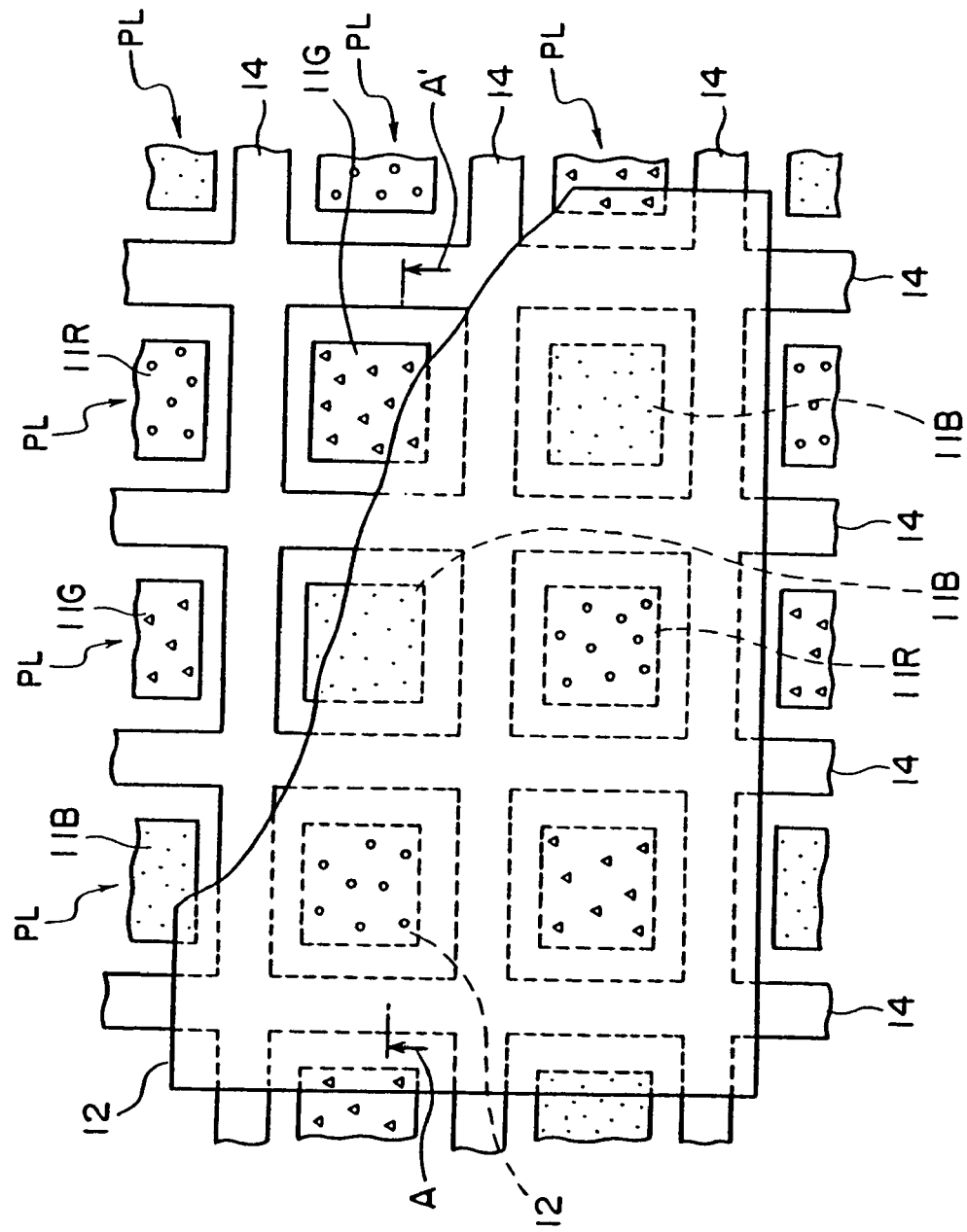
FIG. 2 is a plan view of an embodiment of an organic electroluminescence display according to the present invention showing a portion of a general configuration of a display area of the organic electroluminescence display.

FIG. 1 and FIG. 2 are views of an example of the organic electroluminescence display to which the present invention is applied. Specifically, FIG. 1 is a cross-sectional view of a portion of the general configuration of the display area of the organic electroluminescence display, while FIG. 2 is a plan view of a portion of the general configuration of the display area of the organic electroluminescence display. Note that FIG. 1 is a cross-sectional view along the direction of the line A-A' in FIG. 2. Further, the organic electroluminescence display shown in FIG. 1 and FIG. 2 is an active matrix type of color display.

The display in FIG. 1 has a substrate 1, a number of thin film transistors 2, anode electrodes 10 formed on the transistors 2 via an interlayer insulating layer 7, and organic layers 11G, 11R, and 11B which are formed on the anode electrodes 10 and emit colors of green (G), red (R), and blue (B) respectively. The display also has a cathode electrode 12 formed on the organic layers 11G, 11R, and 11B, a transparent conductive film 16 formed on the cathode electrode 12, and a substrate 18 fixed on the transparent conductive film 16 via an ultraviolet cured resin layer 17.

It should be noted that each organic electroluminescence element, which emits each luminescence color by itself, is configured by an anode electrode 10, an organic layer 11G, 11R, or 11B, and a cathode electrode 12. The pixels PL are configured by these organic electroluminescence elements and thin film transistors 2. Light emitted at the organic layer 11G, 11R, or 11B passes through the cathode electrode 12 side to be output through the substrate 18. Further, as shown in FIG. 2, the pixels PL are arranged in a matrix, while the organic layers 11G, 11R, and 11B are arranged in a regular order.

The substrate 1 is formed of an insulating material. For example, a hard member such as a glass substrate or a pliable member such as a polyamide film or other plastic substrate can be used. It should be appreciated that the direction of passage of light emitted by the above organic electroluminescence element is toward the cathode electrode 12 side, so the substrate 1 need not be a transparent material.

In the thin film transistor 2, a gate electrode 3 with a predetermined pattern is formed on the substrate 1, and a polysilicon layer 20 is formed on the gate electrode 3 via a gate insulating layer 5. Further, an interlayer insulating film 4 is formed so as to cover this polysilicon layer 20.

Further, a source region 21 and a drain region 22 are formed on the gate insulating film 5 at the gate electrode 3 side. The source region 21 and the drain region 22 are electrically connected with interconnections 6 through contact holes (not shown) formed in the interlayer insulating film 4. An interlayer insulating film 7 is formed so as to cover these interconnections 6. Anode electrodes 10 are formed on the interlayer insulating film 7 corresponding to the pixels PL.

The anode electrodes 10 are connected electrically with interconnections 6 through contact holes 8 formed above the interconnections 6 of the interlayer insulating film 7. A high reflectance, conductive material with a large work function such as chrome (Cr), iron (Fe), cobalt (Co), nickel (Ni), copper (Cu), tantalum (Ta), tungsten (W), platinum (Pt), gold (Au) or the like can be used as the material for the interlayer insulating film 7.

The organic layers 11G, 11R, and 11B are formed on the anode electrodes, and an insulating film 13 is formed so as to cover the periphery of the anode electrodes 10 and enclose the organic layers 11G, 11R, and 11B. The insulating film 13 is formed of, for example, silicon oxide or the like.

Ribs 14 are formed on this insulating film 13. The ribs 14, as shown in FIG. 2, are arranged between each pixel PL in a matrix form and have tapered side walls. The ribs 14 function as spacers for masks that are used for forming the organic layers 11G, 11R, and 11B on the anode electrodes 10 by vapor deposition. That is, the ribs 14 function to define the distance between the masks and the anode electrodes 10.

Further, each of the ribs 14 is made of an insulating material layer 14a projecting from the insulating film 13 and a conductive material layer 14b formed on the top of this insulating material layer 14a. The insulating material layer 14a is formed of an organic insulating material such as polyimide, an inorganic insulating material such as silicon oxide or the like. The conductive material layer 14b forms an auxiliary electrode connected with the cathode electrode 12 and is formed of a relatively low resistance conductive material such as aluminum (Al), chrome (Cr) or the like.

Figure 3:
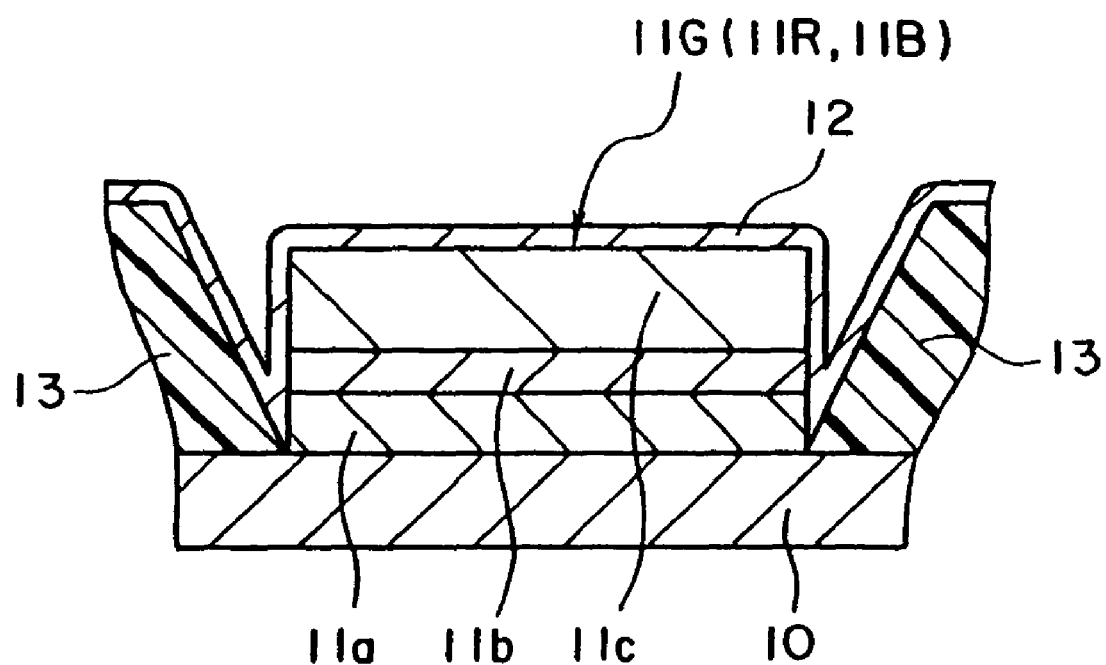
FIG. 3 is a cross-sectional view of an embodiment of a structure of an organic layer according to the present invention.

FIG. 3 is a cross-sectional view of an example of the structure of the organic layer 11G. Organic layers 11R and 11B are substantially similar to organic layer 11G. As shown in FIG. 3, the organic layer 11G is configured with, for example, a positive hole injection layer 11a formed on the anode electrode 10, a positive hole transfer layer 11b stacked on this positive hole injection layer 11a, and a light emitting layer 11c stacked on the positive hole transfer layer 11b serving as an electron transfer layer. The light emitting layer 11c is covered by the cathode electrode 12. The positive hole injection layer 11a, the positive hole transfer layer 11b, and the light emitting layer 11c are formed to predetermined thicknesses by vapor depositing organic materials corresponding to the colors of light emitted.

As the organic material of the positive hole injection layer 11a, for example, m-MTDATA[4-4'-4"-tris(3-methylphenylphenylamino)triphenylamine] can be used. The thickness of the positive hole injection layer 11a is, for example, about 30 nm. As the organic material of the positive hole transfer layer 11b, $f_i$-NPD[4,4-bis(N-1-naphthyl-N-phenylamino) biphenyl] or the like can be used. The thickness of the organic material of the positive hole transfer layer 11b is, for example, about 20 nm. As the organic material of the light emitting layer 11c, Alq3[tris(8-quinolinolato)aluminum (III)] or the like can be used. The thickness of the light emitting layer 11c is, for example, about 50 nm.

The cathode electrode 12 is formed commonly for the pixels PL, covers the surface of the ribs 14, and is connected with the conductive material layers 14b consisting of the top portions of the ribs 14. Further, the cathode electrode 12 is insulated from the anode electrodes 10 by the organic layers 11G, 11R, and 11B and the insulating film 13.

The cathode electrode 12 is a thin metal film having a small work function and higher transmittance such as a magnesium (Mg)-silver (Ag) alloy formed by deposition from binary vapors to a predetermined thickness. The thickness of the cathode electrode 12 is, for example, about 10 nm.

The transparent conductive film 16 is formed so as to cover the cathode electrode 12. The transparent conductive film 16 is formed to a predetermined thickness, for example, by sputtering. A material exhibiting good conductivity by formation under ordinary temperature such as an indium (In)-zinc (Zn)-oxygen (O)-based material can be used as the material for the transparent conductive film 16. The thickness of the transparent conductive film 16 is, for example, about 200 nm.

The substrate 18 is formed of a transparent material. This is to allow passage of the light emitted from the light emitting layer 11c of the organic layers 11G, 11R, and 11B and striking the substrate through the transparent layer 16. For example, a hard member such as a glass substrate or a pliable member such as a polyamide film or other plastic substrate can be used as the transparent material forming the substrate 18.

Figure 4:
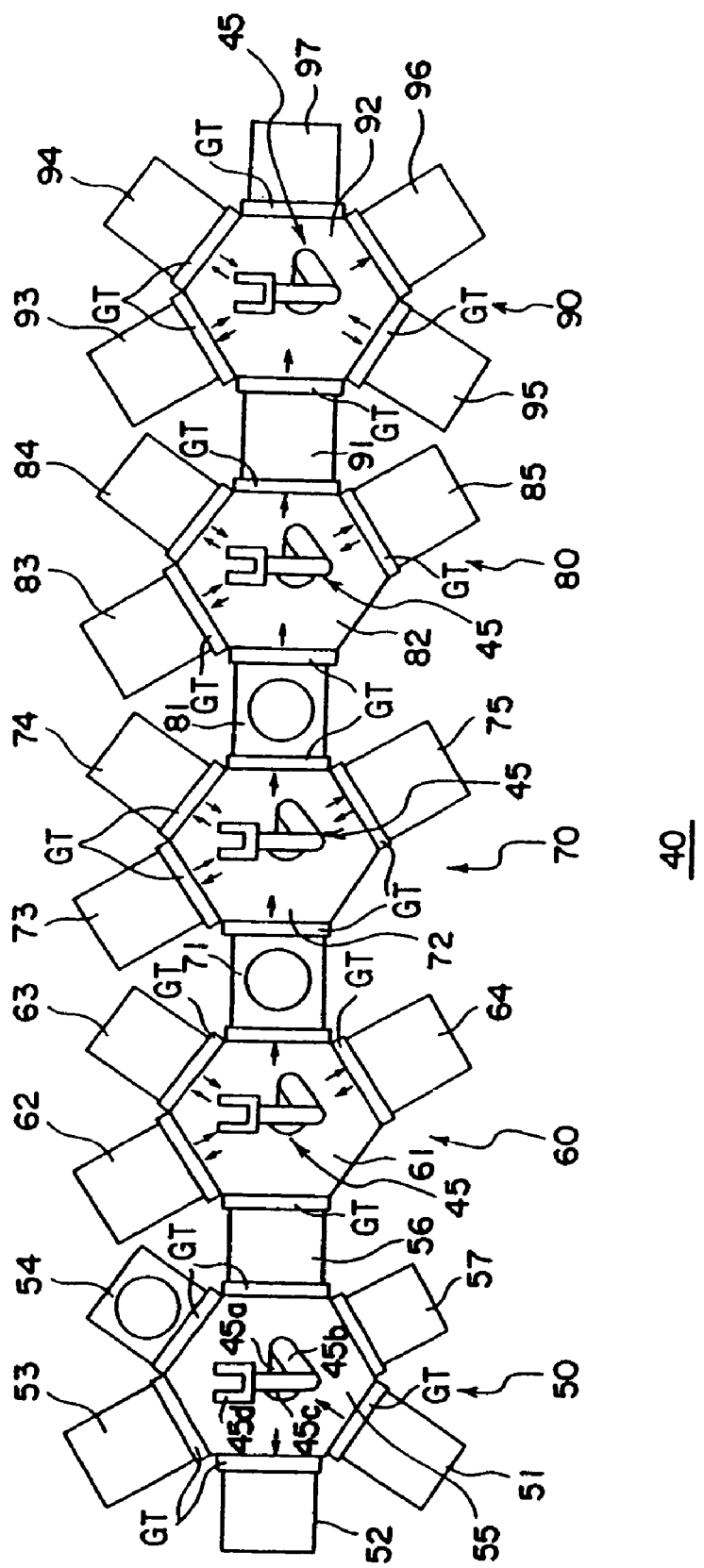
FIG. 4 is a view of a configuration of an apparatus for manufacturing an organic electroluminescence display according to an embodiment of the present invention.

FIG. 4 is a view of the configuration of an apparatus for manufacturing an organic electroluminescence display according to an embodiment of the present invention. The apparatus for manufacturing the organic electroluminescence display 40 forms the above organic layers 11G, 11R, and 11B, the cathode electrode 12, and the transparent conductive film 16. As shown in FIG. 4, the manufacturing apparatus 40 is configured with a loading unit 50, a green organic layer formation unit 60, a red organic layer formation unit 70, a blue organic layer formation unit 80, and an electrode formation unit 90.

The loading unit 50 has a substrate loading chamber 51, a pre-processing chamber 52, a mask loading chamber 53, an alignment chamber 54, a transfer work chamber 55, a transfer chamber 56, and a fixture loading chamber 57. The substrate loading chamber 51, the pre-processing chamber 52, the mask loading chamber 53, the alignment chamber 54, the transfer work chamber 55, the transfer chamber 56, and the fixture loading chamber 57 are configured by vacuum chambers capable of being evacuated inside to a substantive vacuum atmosphere. Further, the substrate loading chamber 51, the pre-processing chamber 52, the mask loading chamber 53, the alignment chamber 54, the fixture loading chamber 57, and the transfer chamber 56 are connected to the circumference of the transfer work chamber 55 via gates Gt. The gates Gt are opened and closed by gate valves (not shown). Further, these gate valves are controlled so as to be opened and closed in response to operations of transfer robots 45.

The substrate loading chamber 51 can be loaded with a substrate 1 on which the organic layers 11G, 11R, and 11B, the cathode electrode 12, and transparent conductive film 16 should be formed. In an embodiment, the substrate loading chamber 51 is a load locked chamber.

Figure 5:
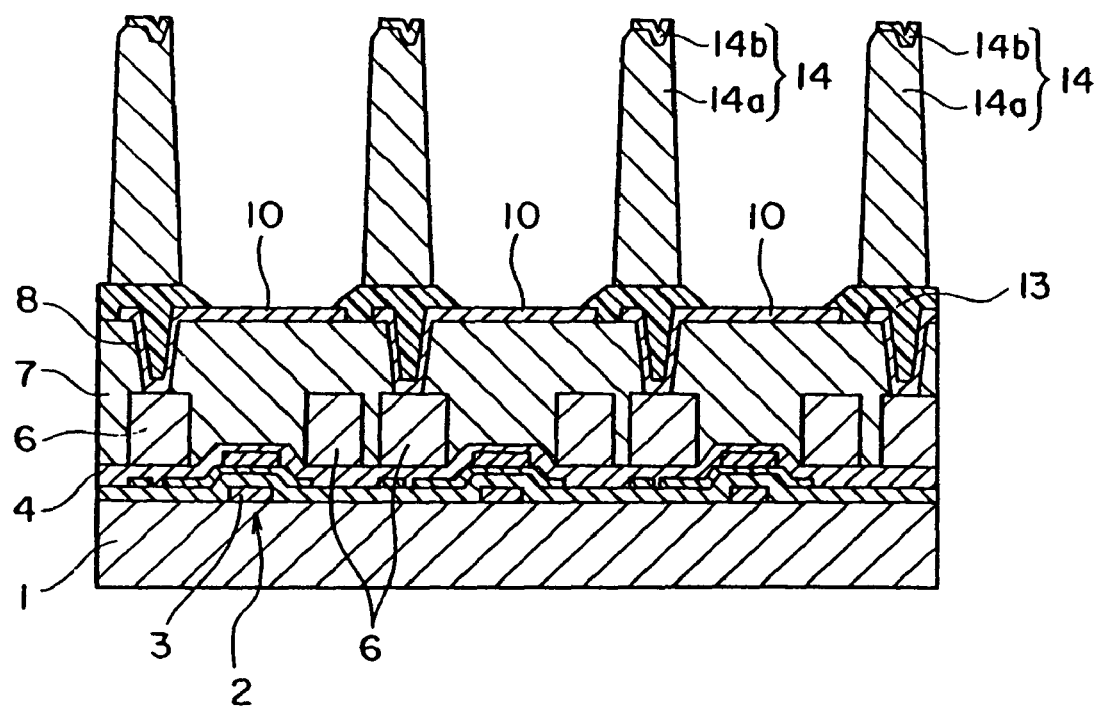
FIG. 5 is a cross-sectional view of a configuration of a substrate before formation of an organic layer.

FIG. 5 is a cross-sectional view of a portion of the configuration of a substrate 1 to be loaded into the substrate loading chamber 51. As shown in FIG. 5, ribs 14 functioning as spacers project above the substrate 1. Further, the surfaces of the anode electrodes 10 surrounded by the ribs 14 are exposed.

The pre-processing chamber 52 treats the surfaces of the anodes 10 and ribs 14 in the state of the substrate 1 shown in FIG. 5. For example, it treats the surface of the substrate 1 by oxygen plasma. Further, it may treat it by ultraviolet ozone. The mask loading chamber 53 is loaded with a mask aligned with and attached (integrally) to the substrate 1. In an embodiment, the mask loading chamber 53 is a load locked chamber.

Figure 6:
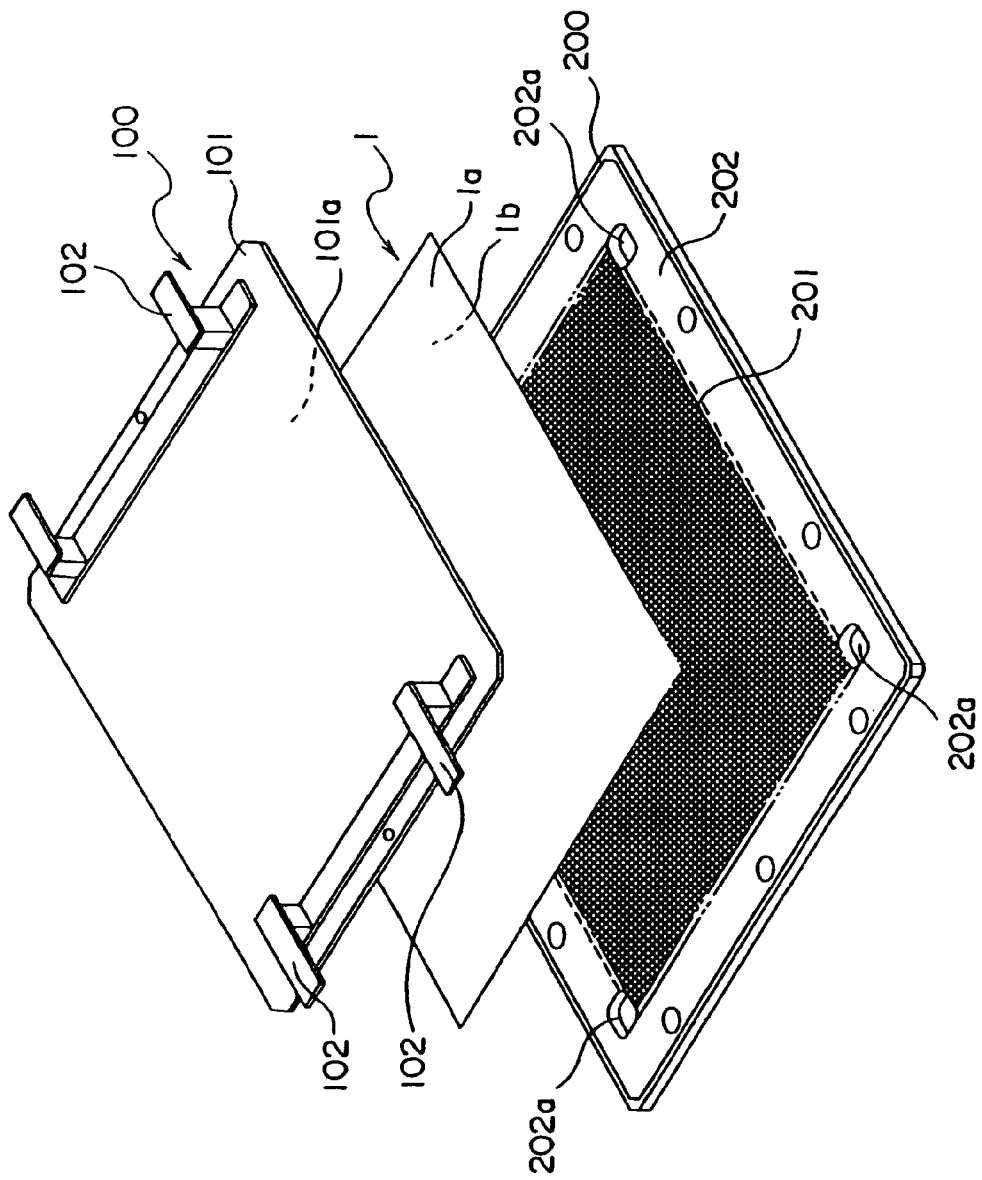
FIG. 6 is a perspective view of an embodiment of a structure of a mask and an attachment fixture attaching it to a substrate.

FIG. 6 is a perspective view of an example of the structure of the mask and the attachment fixture for attaching it to the substrate 1. As shown in FIG. 6, the mask 200 is formed of a plate-shaped member with a rectangular contour. The mask 200 is formed of a magnetic substance such as iron or nickel.

This mask 200 has larger dimensions than that of the substrate 1 and is formed with a number of openings corresponding to patterns of the organic layers 11R, 11G, and 11B in a mask portion 202 surrounded by an outer frame portion 202. The mask can be used in common for the formation of the organic layers 11R, 11G and 11B.

That is, the organic layers 11R, 11G, and 11B are regularly arranged on the substrate 1, thereby making it possible to adjust the alignment between the mask 200 and the substrate 1 to position the openings of the mask 200 at the positions of formation of the organic layers 11R, 11G, and 11B of the substrate 1.

The attachment fixture 100 includes a magnet plate 101 having substantially the same dimensions as the contour of the substrate 1 and grip portions 102 connected to the ends of the magnet plate 101. Parts of the grip portions 102 extend to the sides of the magnet plate 101 so as to project from the ends. These grip portions 102 can be held by arms of the transfer robots 45 (described below). The magnet plate 101 is able to attract the mask 200 by magnetic force.

In FIG. 6, the surface of the magnet plate 101 facing the non-film-formation surface 1a side of the substrate 1 forms a contact surface 101a coming into full contact with the non-film-formation surface 1a of the substrate 1. The substrate 1 and the mask 200 can be attached (integrally) by bringing the contact surface 101a of the magnet plate 101 into contact with the non-film-formation surface 1a of the substrate 1 in the state with the film-formation surface 1b of the substrate 1 facing the mask 200 and the two aligned.

When the contact surface 101a of the magnet plate 101 contacts the non-film-formation surface 1a of the substrate 1, the mask 200 formed of a magnetic substance is attracted to the magnet plate 101 via the substrate 1. Further, the mask portion 201 of the mask 200 is attracted to the film-formation surface 1b by the magnetic force without slack of the mask portion 201. The fixture loading chamber 57 is loaded with the above attachment fixture 100. The fixture loading chamber 57 is a load lock chamber.

The transfer work chamber 55 is provided with the transfer robot 45 inside. This transfer robot 45 is provided with a number of arms 45a, 45b, and 45c pivotally connected in the horizontal direction. Further, the tip of the arm 45a is provided with a holder 45d capable of holding the above substrate 1, the mask 200, and the attachment fixture 100. Furthermore, the transfer robot 45 includes a mechanism capable of elevating the number of arms 45a, 45b, and 45c in the vertical direction. This transfer robot 45 is controlled to transfer the substrate 1, the mask 200, and the attachment fixture 100.

The alignment chamber 54 is provided with an alignment mechanism for the alignment between the above substrate 1 and the mask 200 and the attachment between the substrate 1 and the mask 200 using the attachment fixture 100.

Figure 7:
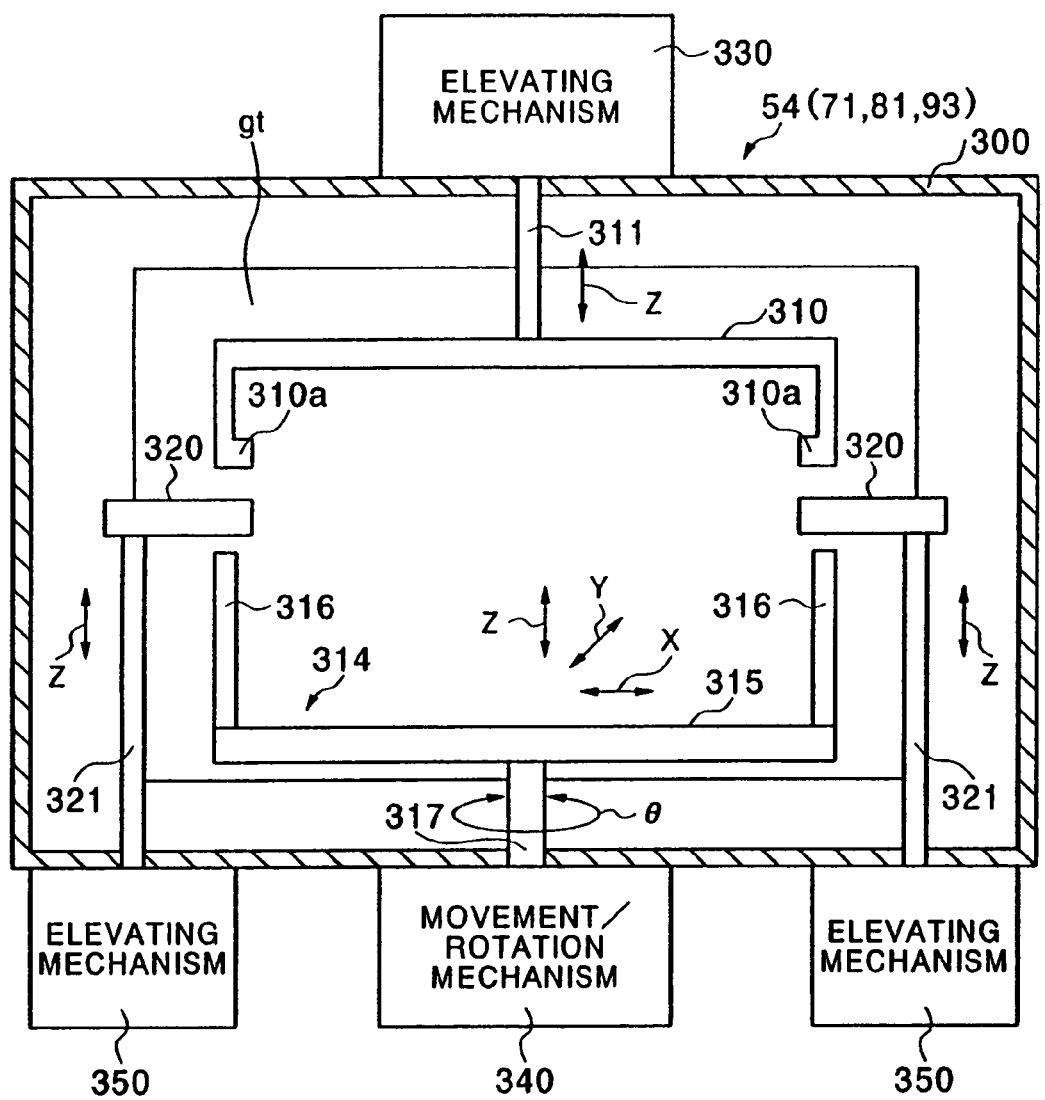
FIG. 7 is a view of a structure of an alignment chamber.

FIG. 7 is a view of the structure of the alignment chamber 54. It should be noted that alignment chambers 71 and 81 (described below) and the substrate/mask separating chamber 93 also include alignment mechanisms similar to the alignment mechanism shown in FIG. 7.

As shown in FIG. 7, the alignment chamber 54 is provided with a fixture holder 310 arranged at the upper portion inside a partition wall 300, a substrate holder 314 below this fixture holder 310, and mask holders 320 arranged at the two sides of the substrate holder 314.

The fixture holder 310 is provided with holder portions 310a at the lower ends. The grip portions 102 of the attachment fixture 100 are held by these holder portions 310a. This fixture holder 310 is connected with an elevating mechanism 330 arranged at the upper portion outside of the partition wall 300 via a connecting rod 311. This elevating mechanism 330 elevates the fixture holder 310 in the vertical direction (z-direction). The elevating mechanism 330 can be, for example, a servo motor, a transmission mechanism, or the like.

The substrate holder 314 is provided with a connecting part 315 connected to a rotatable shaft 317, a number of supports 316 standing at the two ends of this connecting part 315 and can support the periphery of the film-formation surface 1b of the substrate 1 by the tips of the support 316. It should be noted that the supports 316 can be inserted into holes formed at the four corners of the mask portion 201 of the mask 200 shown in FIG. 6. The rotatable shaft 317 connected to the substrate holder 314 is connected to a movement/rotation mechanism 340 arranged at the outside of the bottom of the partition wall 300.

This movement/rotation mechanism 340 holds the substrate holder 314 rotatably in the rotational direction $f\!Æ$ around the rotatable shaft 317 and movably holds the substrate holder 314 in the z-direction and the x- and y-direction perpendicularly intersecting the z-direction. The movement/rotation mechanism 340 may be, for example, a servo motor, a transmission mechanism, or the like.

The mask holders 320 can support the two ends of the bottom surface of the above mask 200. Each mask holder 320 is connected to an elevating mechanism 350 via a connecting rod 321. The elevating mechanism 350 holds the mask holder 320 movably in the z-direction. It should be appreciated that the elevating mechanism 350 is shown split in FIG. 7, but is actually a single mechanism and simultaneously elevates the mask holders 320.

The transfer chamber 56 includes a loading path for loading the substrate 1 and the mask 200 attached by the attachment fixture 100 in the alignment chamber 54 to the green organic layer formation unit 60. The green organic layer formation unit 60 forms the green organic layer 11G. This green organic layer formation unit 60 includes a transfer work chamber 61 and a number of vapor deposition processing chambers 62, 63, and 64. The transfer work chamber 61 and a number of vapor deposition processing chambers 62, 63 and 64 include vacuum chambers that are capable of being evacuated inside to a substantive vacuum atmosphere. Further, the vapor deposition processing chambers 62, 63, and 64 are connected to the circumference of the transfer work chamber 61 via gates Gt.

The above configured transfer robot 45 is arranged in the transfer work chamber 61. This transfer robot 45 transfers the substrate 1 and the mask 200 between the vapor deposition processing chambers 62, 63, and 64 and to the red organic layer formation unit 70. The vapor deposition processing chamber 62 forms the hole injection layer 11*a* of the organic layer 11G. The vapor deposition processing chamber 63 forms the hole transfer layer 11*b* of the organic layer 11G. The vapor deposition processing chamber 64 forms the light emitting layer 11*c* of the organic layer 11G.

Figure 8:
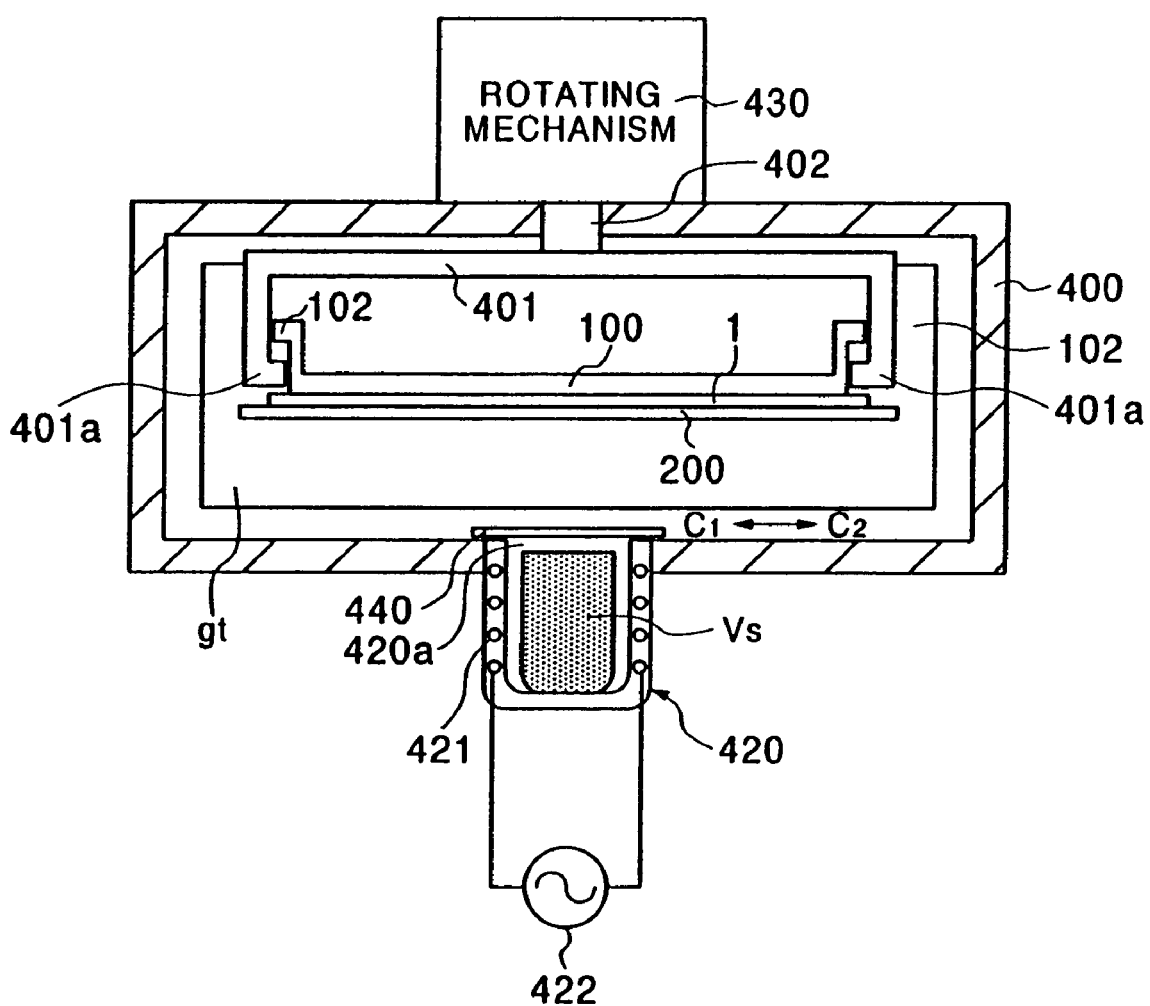
FIG. 8 is a cross-sectional view of an embodiment of a configuration of a vapor deposition processing chamber.

FIG. 8 is a cross-sectional view of an example of the configuration of the vapor deposition processing chambers 62, 63, and 64. It should be noted that the vapor deposition processing chambers 73, 74, and 75 in the red organic layer formation unit 70 (described below) and the vapor deposition processing chambers 83, 84, and 85 in the blue organic layer formation unit 80 (described below) also have basically the same configurations as the configuration shown in FIG. 8.

As shown in FIG. 8, a fixture holder 401 is arranged at the top of the inside of the partition wall 400 and is capable of holding the attachment fixture 100 attaching the substrate 1 to the mask 200. This fixture holder 401 is provided with holding portions 401*a* holding the grip portions 102 of the attachment fixture 100 at its lower ends. Further, the fixture holder 401 is connected with a rotatable shaft 402. The rotatable shaft 402 is connected to the rotating mechanism 430 arranged at the top outside of the partition wall 400.

The rotating mechanism 430 rotates the rotatable shaft 402 at a predetermined speed at the time of vapor deposition. The rotating mechanism 430 can be, for example, a servo motor, a transmission mechanism, or the like.

When the rotatable shaft 402 is rotated by the rotating mechanism 430, the substrate 1 and the mask 200 also rotate around the rotatable shaft 402.

A heating vessel 420 is arranged under the partition wall 400. The heating vessel 420 holds a vapor deposition material Vs made of the above described organic material.

This heating vessel 420 is provided with an opening 420*a* on the top end. A shutter 440 opening and closing the opening 420*a* is arranged above this opening 420*a*. The shutter 440 is driven by a movement mechanism (not shown) in the opening and closing directions C1 and C2. This shutter 440 is arranged for preventing wasted consumption of the organic material by closing the opening 420*a* when not performing vapor deposition.

An induction coil 421 is built into the heating vessel 420. This induction coil 421 is connected with an alternating current supply 422. By supplying an alternating current to the induction coil 421 from the alternating current supply 422, the heating vessel 420 itself is heated by an electromagnetic field generated from the induction coil 421. Thus, the vapor deposition material Vs accommodated in the heating vessel 420 is evaporated. It should be noted that the alternating current supply 422 can control the temperature of the heating vessel 420 by adjusting the supplied current.

The red organic layer formation unit 70 forms the organic layer 11R. This red organic layer formation unit 70 includes an alignment chamber 71, a transfer work chamber 72, and a number of vapor deposition processing units 73, 74, and 75. The transfer work chamber 72 and vapor deposition processing units 73, 74, and 75 are configured by vacuum chambers that are capable of being evacuated inside them to a substantive vacuum atmosphere. Further, the vapor deposition processing units 73, 74, and 75 are connected to the circumference of the transfer work chamber 72 via the gates Gt.

The alignment chamber 71 includes the same alignment mechanism as the alignment chamber 54 of the loading unit 50. This alignment chamber 71 separates the substrate 1 and the mask 200 as attached in the alignment chamber 54, realigns the substrate 1 and the mask 200, and reattaches the substrate 1 and the mask 200 by the attachment fixture 100.

The above configured transfer robot 45 is arranged in the transfer work chamber 72. This transfer robot 45 transfers the substrate 1 and the mask 200 between the vapor deposition processing units 73, 74, and 75 and to the blue organic layer formation unit 80. The vapor deposition processing chamber 73 forms the hole injection layer 11*a* of the organic layer 11R. The vapor deposition processing chamber 74 forms the hole transfer layer 11*b* of the organic layer 11R. The vapor deposition processing chamber 73 forms the light emitting layer 11*c* of the organic layer 11R.

The blue organic layer formation unit 80 forms the organic layer 11B. This blue organic layer formation unit 80 includes an alignment chamber 81, a transfer work chamber 82, and a number of vapor deposition processing units 83, 84, and 85.

The alignment chamber 81 includes the same alignment mechanism as the alignment chamber 71 of the red organic layer formation unit 70. This alignment chamber 81 separates the substrate 1 and the mask 200 attached in the alignment chamber 71, realigns the substrate 1 and the mask 200, and reattaches the substrate 1 and the mask 200 by the attachment fixture 100.

The above configured transfer robot 45 is arranged in the transfer work chamber 82. This transfer robot 45 can transfer the substrate 1 and the mask 200 between the vapor deposition processing units 83, 84, and 85 and to the electrode formation unit 90. The vapor deposition processing chamber 83 forms the hole injection layer 11*a* of the organic layer 11B. The vapor deposition processing chamber 84 forms the hole injection transfer layer 11*b* of the organic layer 11B. The vapor deposition processing chamber 85 forms the light emitting layer 11*c* of the organic layer 11B.

The electrode formation unit 90 includes a loading chamber 91, a transfer work chamber 92, a substrate/mask separation chamber 93, an electrode formation unit 94, a sputtering chamber 95, a substrate unloading chamber 96, and a fixture/mask unloading chamber 97. The loading chamber 91, the transfer work chamber 92, the substrate/mask separation chamber 93, the electrode formation unit 94, the sputtering chamber 95, the substrate unloading chamber 96, and the fixture/mask unloading chamber 97 are configured by vacuum chambers capable of being evacuated inside to a substantive vacuum atmosphere. Further, the loading chamber 91, the transfer work chamber 92, the substrate/mask separation chamber 93, the electrode formation unit 94, the sputtering chamber 95, the substrate unloading chamber 96, and the fixture/mask unloading chamber 97 are connected to the circumference of the transfer work chamber 92 via the gates Gt.

The loading chamber 91 includes a loading path for loading the substrate 1 and the mask 200 after the formation of the organic layer 11B in the blue organic layer formation unit 80 to the transfer work chamber 92. The substrate/mask separation chamber 93 includes the same alignment mechanism as the above described alignment chambers 54, 71, and 81. This substrate/mask separation chamber 93 separates the substrate 1 and the mask 200 attached by the attachment fixture 100 by the alignment mechanism.

The electrode formation chamber 94 is provided with a vapor deposition apparatus for forming the above cathode electrode 12 on the substrate 1 after being separated from the mask 200. It should be noted that this vapor deposition apparatus is a well-known vapor deposition apparatus, so a detailed explanation of the vapor deposition apparatus will be omitted.

The sputtering chamber 95 forms the above described transparent conductive film 16 on the substrate 1 after the cathode electrode 12 is formed by sputtering. The sputtering chamber 95 is provided, for example, with a direct current sputtering apparatus. It should be noted that the direct current sputtering apparatus is well known, so a detailed explanation of the direct current sputtering apparatus will be omitted.

The substrate unloading chamber 96 is a vacuum chamber for unloading the substrate 1 after the transparent conductive film 16 is formed from the electrode formation unit 90. The fixture/mask unloading chamber 97 is a vacuum chamber for unloading the mask 200 and the attachment fixture 100 after being separated from the substrate 1 from the electrode formation unit 90. The transfer work chamber 92 is provided with the above configured transfer robot 45. This transfer robot 45 transfers the substrate 1, the mask 200, and the attachment fixture 100.

Next, an explanation will be made of a method of manufacturing an organic electroluminescence display using the above manufacturing apparatus 40. First, the necessary number of substrates 1 in the state shown in FIG. 5 are loaded into the substrate loading chamber 57 in advance. Further, the necessary number of the masks 200 are loaded into the mask loading chamber 53 in advance. Furthermore, the necessary number of attachment fixtures 100 are loaded into the fixture loading chamber 57.

Conversely, the heating vessel 420 of each of the green organic layer formation unit 60, the red organic layer formation unit 70, and the blue organic layer formation unit 80 is heated in advance so that the temperature of the vapor deposition material Vs is controlled so as to be evaporated at a constant evaporation rate. It should be noted that the heating vessel 420 is closed by the shutter 440 in advance. Further, it is preferable that the evaporation rate in each of the green organic layer formation unit 60, the red organic layer formation unit 70, and the blue organic layer formation unit 80 be controlled in accordance with the time for forming a film in the evaporating chamber which forms the thickest layer. That is, the cycle time in an organic layer formation process depends on the time for forming the thickest layer.

Next, the gate valve of the substrate loading chamber 57 is opened to load the substrate 1 in the substrate loading chamber 57 into the pre-processing chamber 52 by the transfer robot 45. The pre-processing chamber 52 uses oxygen plasma to treat the substrate 1 under the conditions of, for example, 400 sccm, 50 W of a high frequency power, and 120 sec of treatment time.

Figure 9:
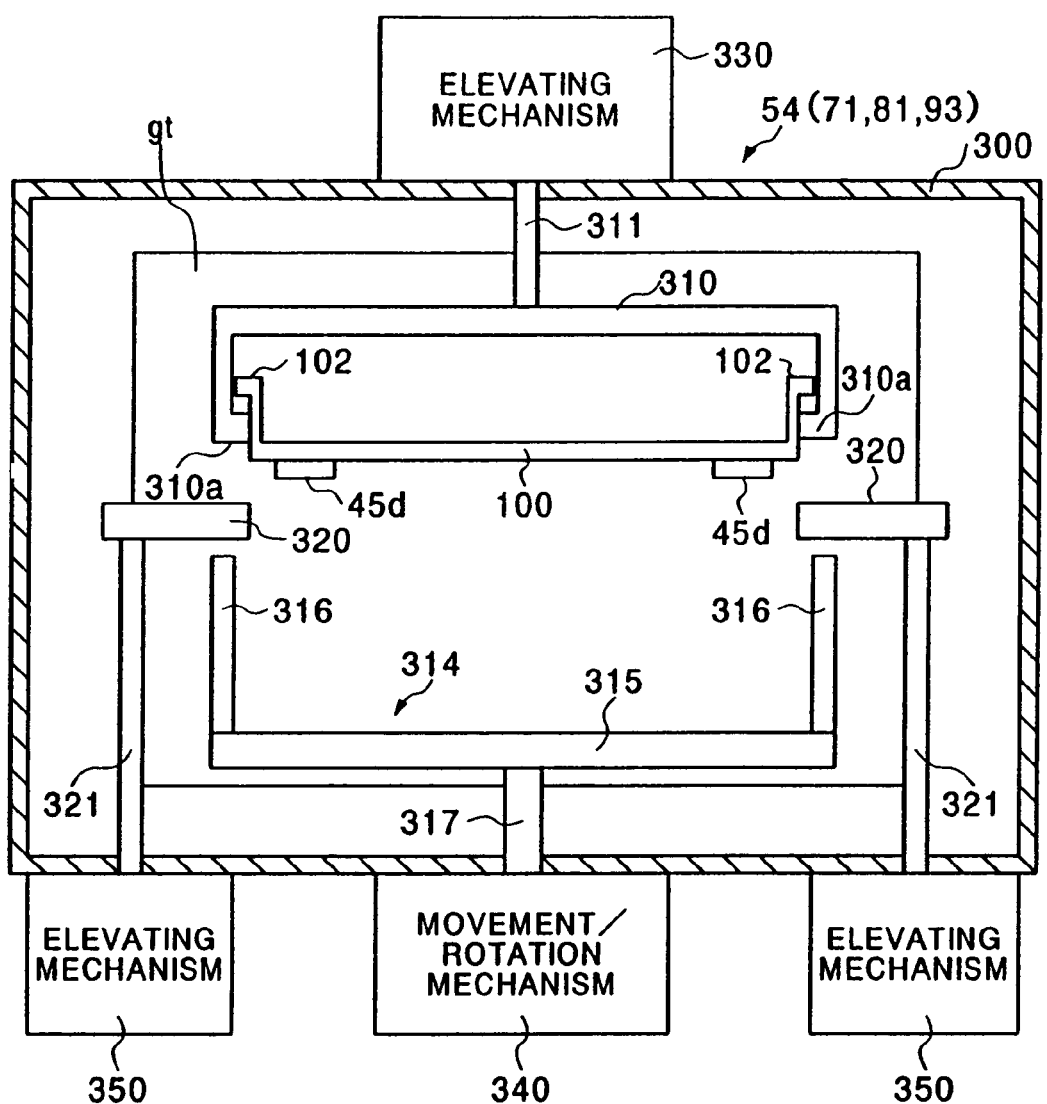
FIG. 9 is an explanatory view of an embodiment of an operational procedure of an alignment mechanism in an alignment chamber.

Before the completion of this oxygen plasma treatment, as shown in FIG. 9, the attachment fixture 100 in the fixture loading chamber 57 is held by the holder 45d of the transfer robot 45 and loaded into the alignment chamber 54. In FIG. 9, the grip portions 102 of the attachment fixture 100 loaded into the alignment chamber 54 through the gate Gt are positioned to be able to be held by the holder portions 310a of the fixture holder 310.

Figure 10:
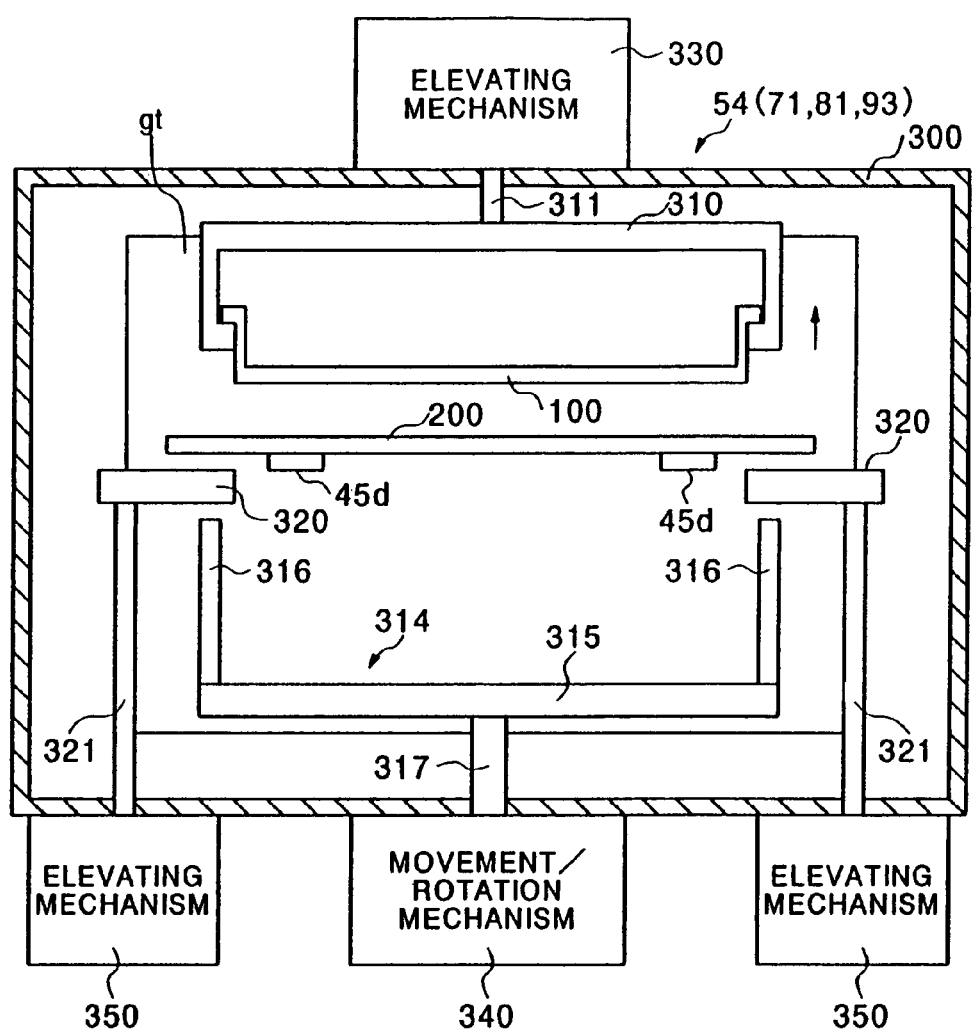
FIG. 10 is an explanatory view of the operational procedure of the alignment mechanism following FIG. 9.

Further, as shown in FIG. 10, the fixture holder 310 is elevated to a predetermined position by the elevating mechanism 330. By the elevation of the fixture holder 310, the attachment fixture 100 is separated from the holder 45d of the transfer robot 45 so that the attachment fixture 100 is held by the fixture holder 310.

Further, as shown in FIG. 10, after the completion of the transfer of the attachment fixture 100 to the alignment chamber 54, the transfer robot 45 loads the mask 200 in the mask loading chamber 53 into the alignment chamber 54. The loading position of the mask 200 is between the attachment fixture and the mask holder 320.

Figure 11:
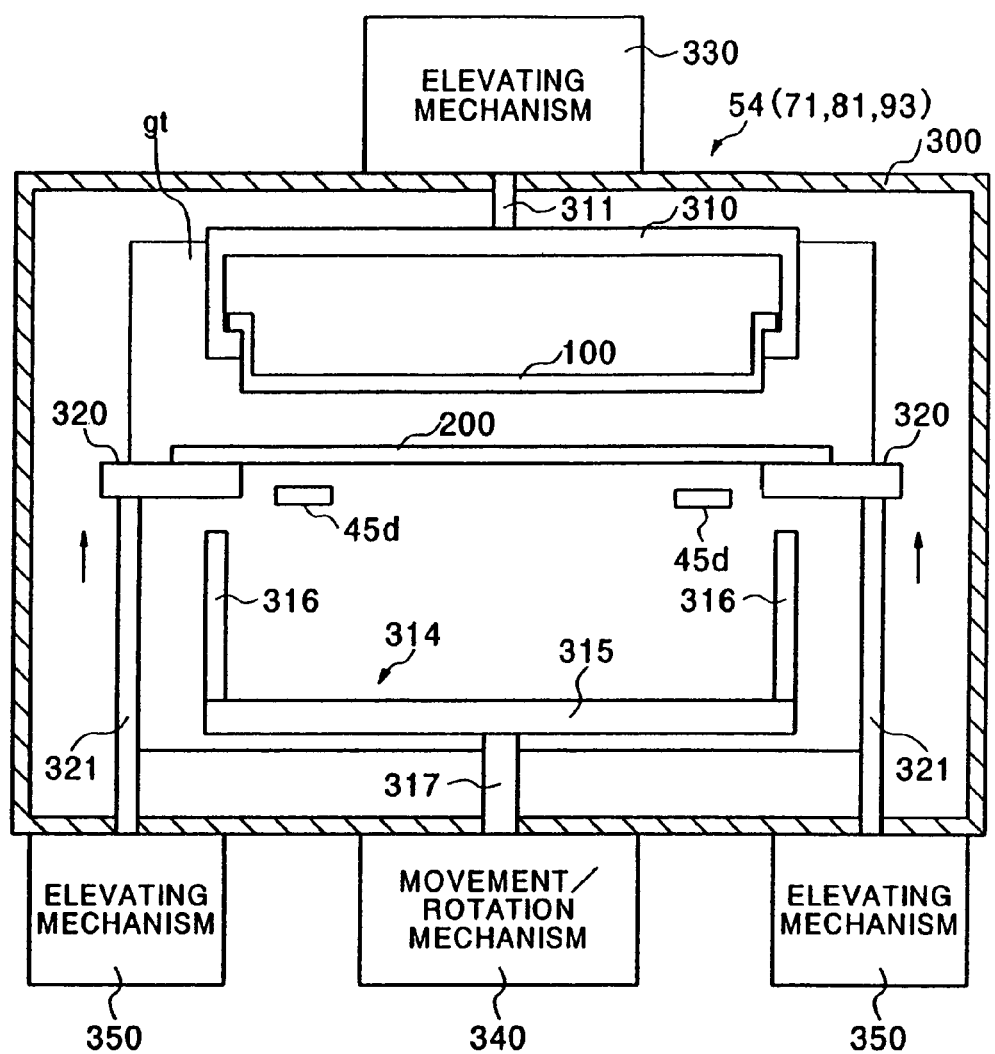
FIG. 11 is an explanatory view of the operational procedure of the alignment mechanism following FIG. 10.

From this state, as shown in FIG. 11, the mask holder 320 is elevated to a predetermined position by the elevating mechanism 350. By the elevation of the mask holder 320, the mask 200 is separated from the holder of the transfer robot 45 and held by the mask holder 320.

Figure 12:
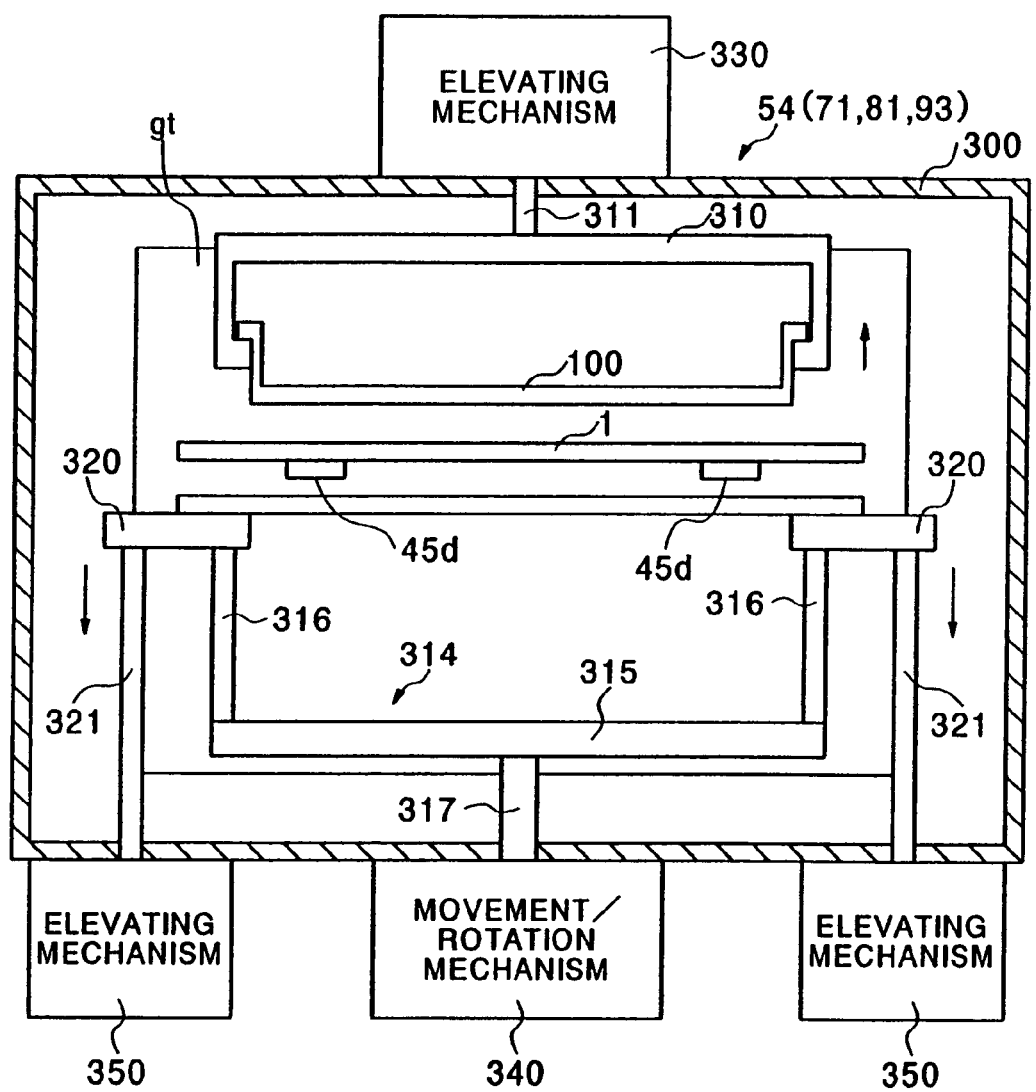
FIG. 12 is an explanatory view of the operational procedure of the alignment mechanism following FIG. 11.

Next, in the state with the attachment fixture 100 held by the fixture holder 310 and the mask 200 held by the mask holder 320, as shown in FIG. 12, the substrate 1 finished being treated on its surface in the pre-processing chamber 52 is loaded into the alignment chamber 54 by the transfer robot 45.

As shown in FIG. 12, before loading the substrate 1 into the alignment chamber 54, the mask holder 320 is lowered to a predetermined position and a space is formed where there is no interference with the substrate 1 between the attachment fixture 100 and the mask 200.

Figure 13:
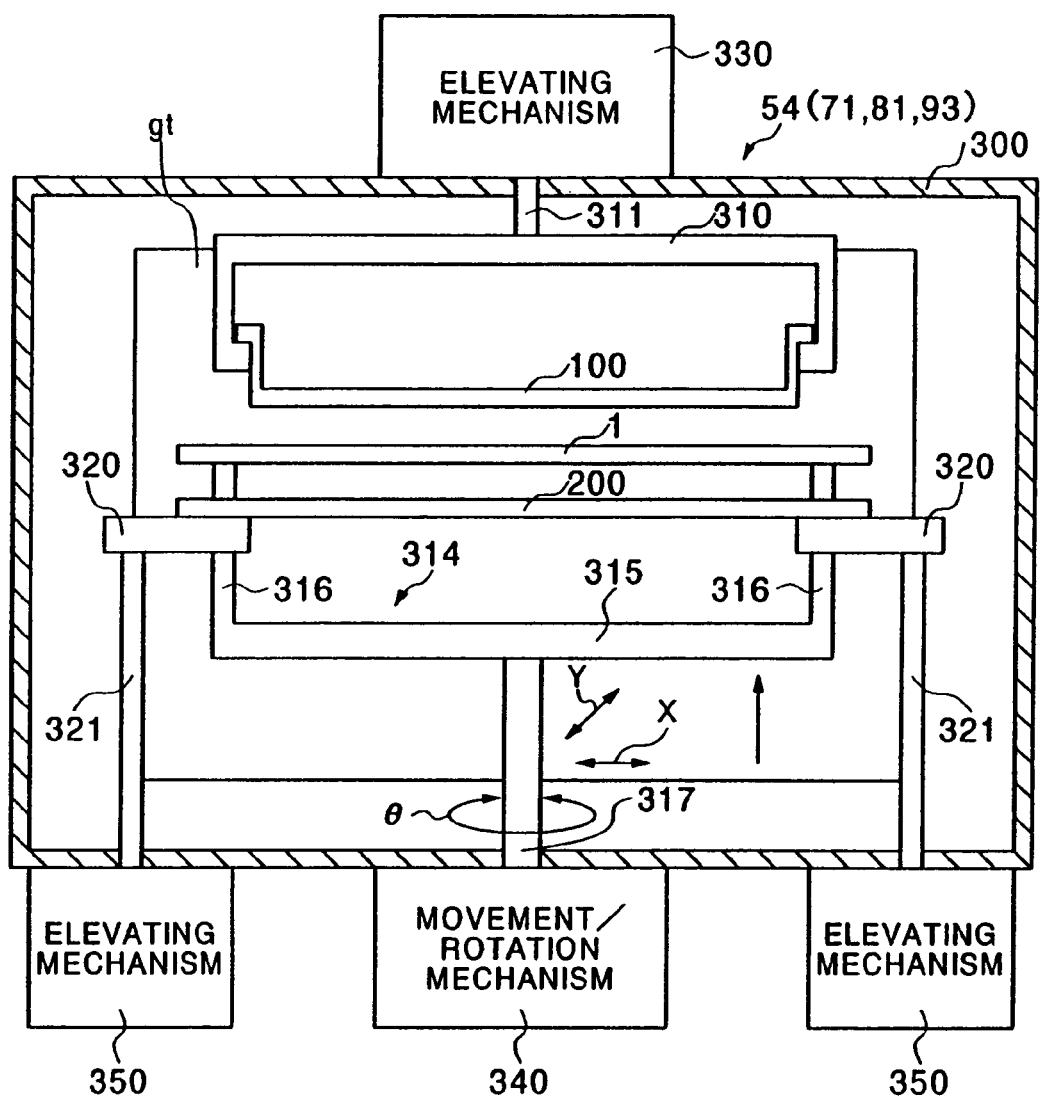
FIG. 13 is an explanatory view of the operational procedure of the alignment mechanism following FIG. 12.

Next, as shown in FIG. 13, the substrate holder 314 is elevated to a predetermined position by the movement/rotation mechanism 340. By the elevation of the substrate holder 314, the substrate 1 is separated from the holder 45d of the transfer robot 45 and held by the supports 316.

As a result, the attachment fixture 100 is held by the fixture holder 310, the mask 200 is held by the mask holder 320, and the substrate 1 is held by the substrate holder 314.

Next, by adjusting the rotational position of the substrate 1 in the $f\!\!E$ direction and the position in the X- and Y-directions by the movement/rotation mechanism 340 from the above state, the substrate 1 and mask 200 are aligned. This alignment work is based on the information of the position and posture of the substrate 1 with respect to the mask 200 obtained by image processing of the images of the mask 200 and substrate 1 taken by, for example, an image pickup device (not shown).

Figure 14:
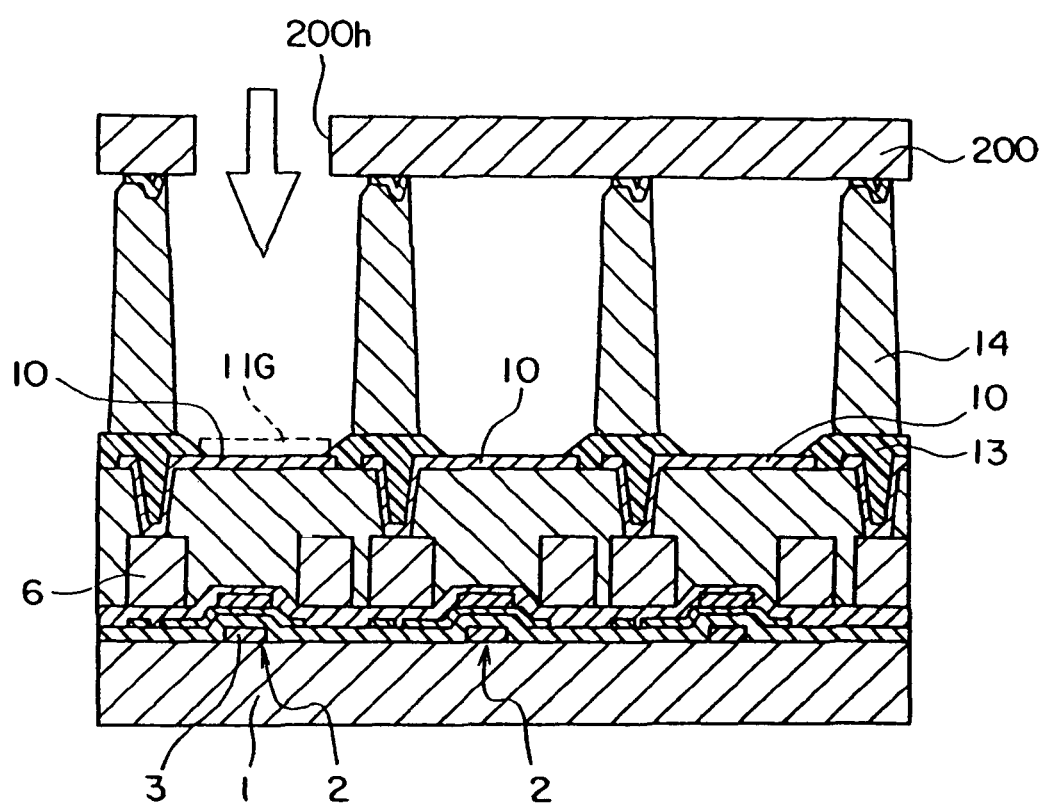
FIG. 14 is a view illustrating the alignment of a mask to a position of formation of an organic layer on a substrate.

Further, as shown in FIG. 14, the alignment is performed so that the opening 200h of the mask 200 is located at the position of formation of the organic layer 11G to be formed on the substrate 1.

Figure 15:
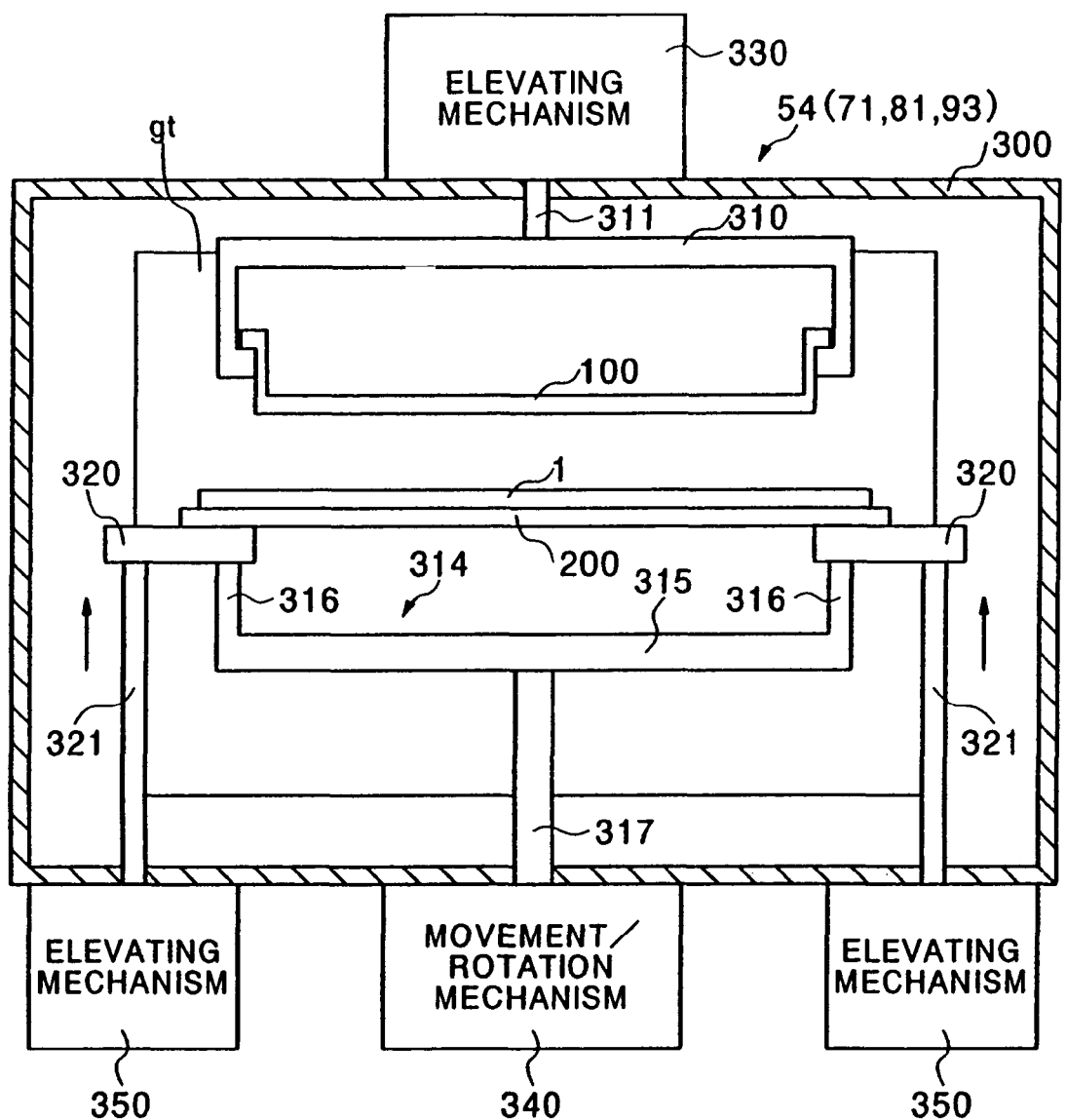
FIG. 15 is an explanatory view of the operational procedure of the alignment mechanism following FIG. 13.

After the completion of the alignment work between the substrate 1 and the mask 200, as shown in FIG. 15, the mask holder 320 is elevated to a predetermined position to bring the substrate 1 into contact with the mask 200 and place the substrate 1 on the mask 200.

Figure 16:
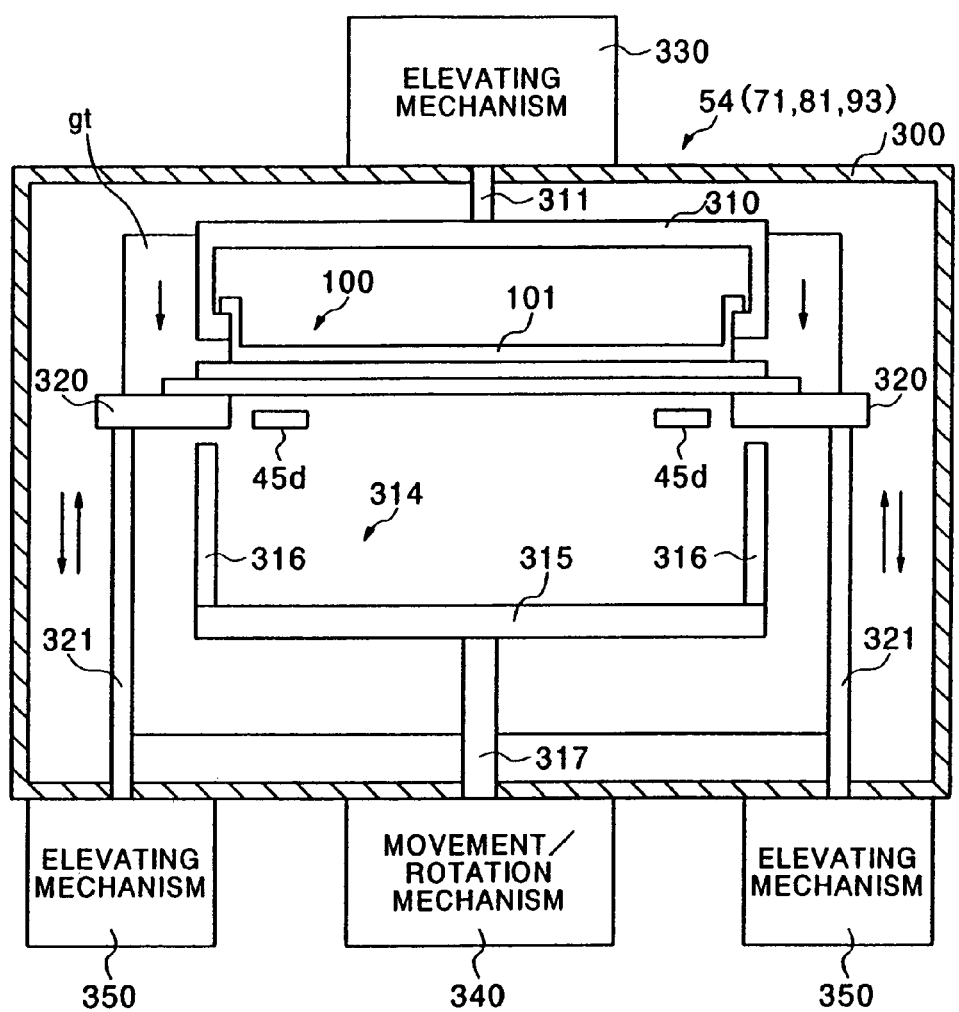
FIG. 16 is an explanatory view of the operational procedure of the alignment mechanism following FIG. 15.

From this state, as shown in FIG. 16, the mask holder 320 is further elevated to bring the substrate 1 into contact with the attachment fixture 100. As a result, the mask 200 is attracted to the magnet plate 101 by the magnetic force of the magnet plate 101 so that the mask 200 and the substrate 1 are attached and alignment is maintained.

Further, by the attachment of the mask 200 and the substrate 1, as shown in FIG. 14, the mask 200 contacts the tops of the ribs 14 so that the distance between the mask 200 and the anode electrode 10 is maintained constant.

Next, as shown in FIG. 16, in the state with the attached attachment fixture 100, substrate 1, and mask 200 held by the mask holder 320, the holder 45d of the transfer robot 45 is inserted below the mask 200. Further, by lowering the mask holder 320, the attached attachment fixture 100, substrate 1, and mask 200 become held by the fixture holder 310. In this state, by lowering the fixture holder 310 to a predetermined position, the attached attachment fixture 100, substrate 1, and mask 200 are placed on the holder 45d of the transfer robot 45.

Next, the attached attachment fixture 100, substrate 1, and mask 200 placed on the holder 45d of the transfer robot 45 are transferred to the transfer chamber 56. Next, the attached attachment fixture 100, substrate 1, and mask 200 transferred to the transfer chamber 56 are transferred to the vapor deposition processing chamber 62 by the transfer robot 45 arranged in the transfer work chamber 61.

Figure 17:
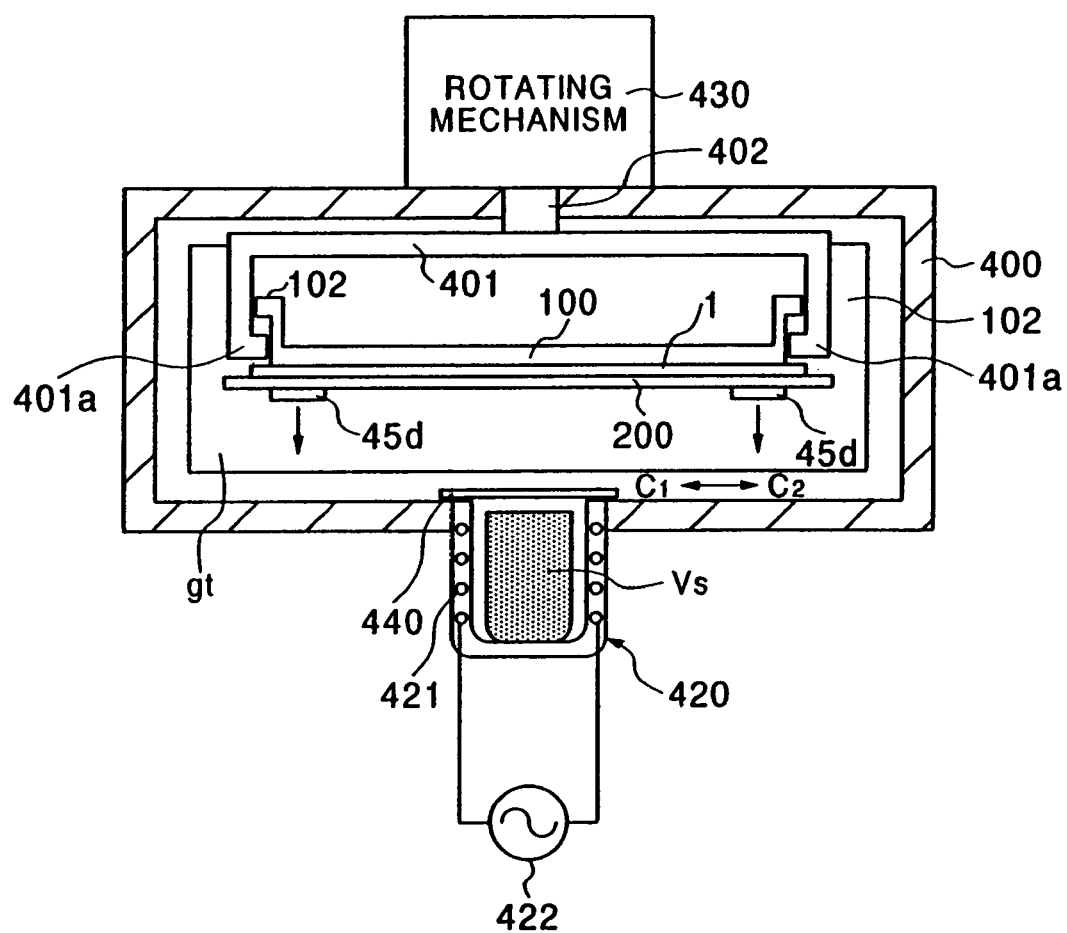
FIG. 17 is an explanatory view of an attached substrate and a mask loaded into a vapor deposition processing chamber.

As shown in FIG. 17, the attached attachment fixture 100, substrate 1, and mask 200 transferred inside the partition wall 400 of the vapor deposition processing chamber 62 through the gate Gt are held by the fixture holder 401 by lowering the holder portion 45d of the transfer robot 45 to a predetermined position.

Figure 18:
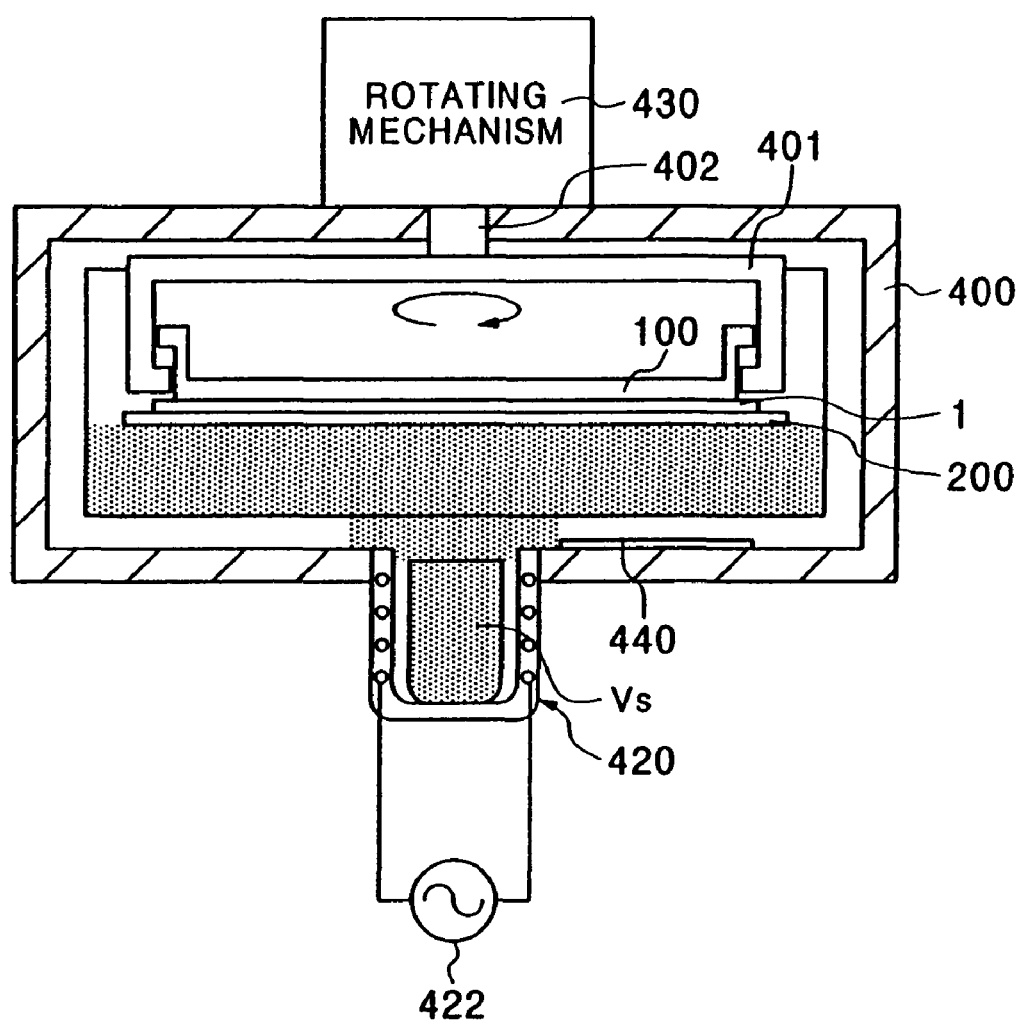
FIG. 18 is an explanatory view of vapor deposition taking place in a vapor deposition processing chamber.

After the substrate 1 and the mask 200 are held by the fixture holder 401, as shown in FIG. 18, the fixture holder 401 is made to rotate at a predetermined rotational speed and the shutter 440 is opened for the vapor deposition to form the hole injection layer 11a of the organic layer 11G to a predetermined thickness. The time for forming the hole injection layer 11a is determined by the vapor deposition rate. Further, by rotating the substrate 1 and the mask 200, the hole injection layer 11a is formed to a uniform thickness.

After forming the hole injection layer 11a, the same procedure described above is used to transfer the attached attachment fixture 100, substrate 1, and mask 200 to the vapor deposition processing chamber 63 by the transfer robot 45 provided in the transfer work chamber 61 to form the hole transfer layer 11b of the organic layer 11G.

The light emitting layer 11c of the organic layer 11G is formed in the vapor deposition processing chamber 64 in the same way. As a result, the organic layer 11G including the hole injection layer 11a, the hole transfer layer 11b, and the light emitting layer 11c is formed stacked on the anode electrodes 10 of the substrate 1. Next, the substrate 1 formed with the organic layer 11G is transferred to the alignment chamber 71 of the red organic layer formation unit 70 in the state attached to the mask 200.

Figure 19:
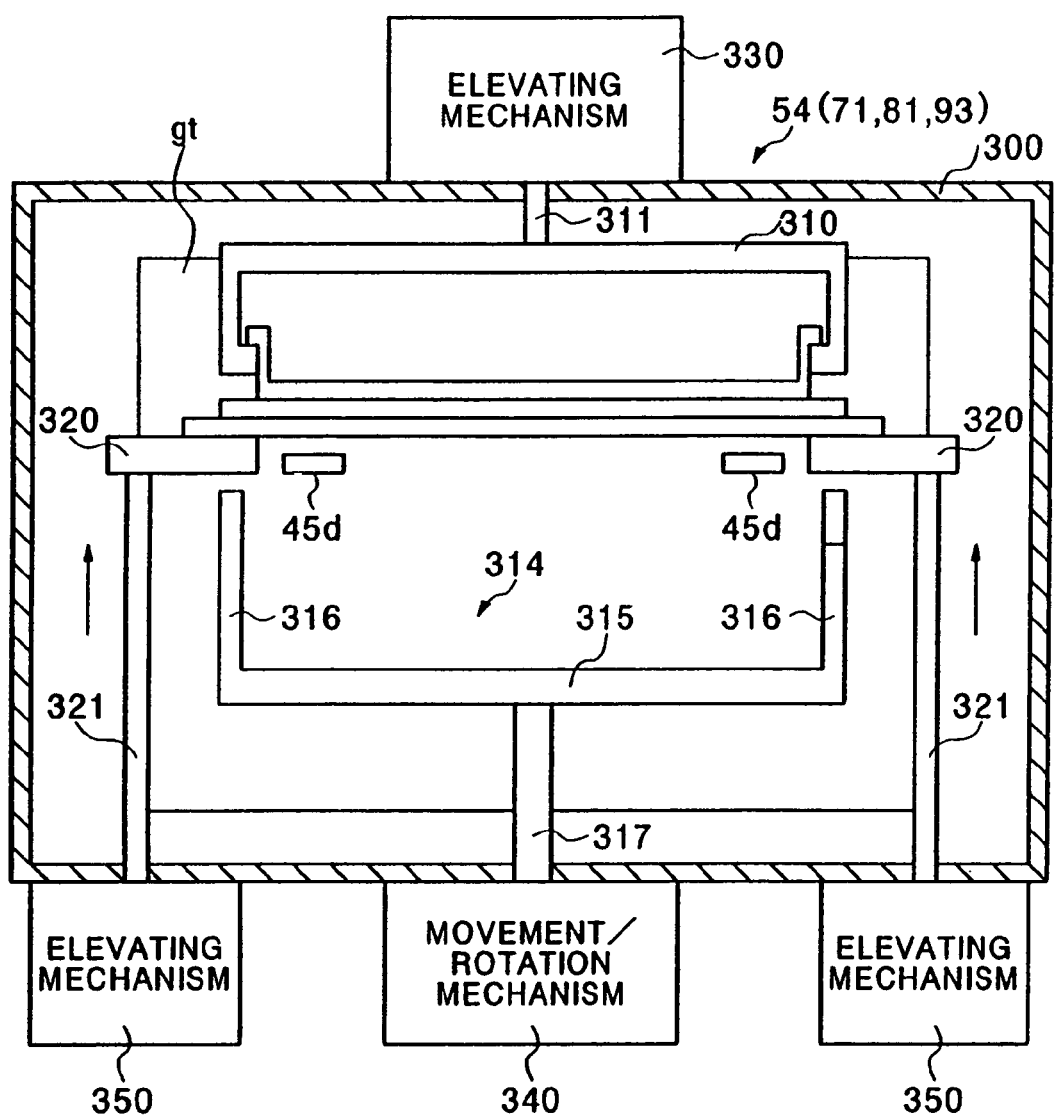
FIG. 19 is an explanatory view of an embodiment of an operational procedure of an alignment mechanism in an alignment chamber.

As shown in FIG. 19, after the substrate 1 and the mask 200 attached by the attachment fixture 100 is loaded into the alignment chamber 71 by the holder 45 of the transfer robot 45, the mask holder 320 is elevated to a predetermined position to separate the mask 200 from the holder 45d and hold them by the mask holder 320.

Figure 20:
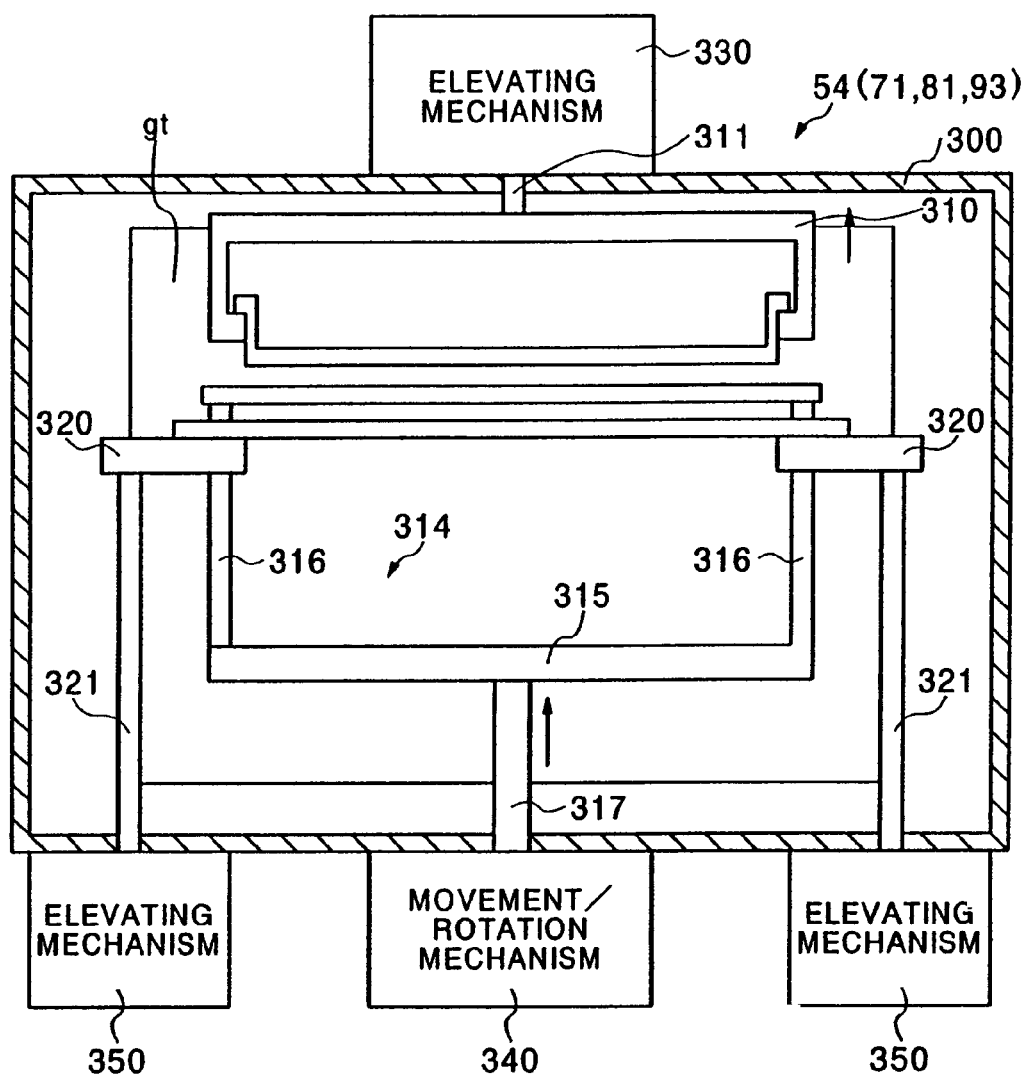
FIG. 20 is an explanatory view of the operational procedure of the alignment mechanism following FIG. 19.

Next, as show in FIG. 20, the fixture holder 310 is elevated to a predetermined position. By this elevation of the fixture holder 310, only the attachment fixture 100 is separated from the substrate 1 and the mask 200.

From the state with only the attachment fixture 100 separated from the substrate 1 and the mask 200, the substrate holder 314 is elevated to a predetermined position. Due to the elevation of the substrate holder 314, the substrate 1 and the mask 200 are separated.

As a result, the attachment fixture 100 is held by the fixture holder 310, the mask is held by the mask holder 320, and the substrate 1 is held by the substrate holder 314. From this state, in the same way with the operation explained with reference to FIG. 15 and FIG. 16, the substrate 1 and the mask 200 are realigned.

Figure 21:
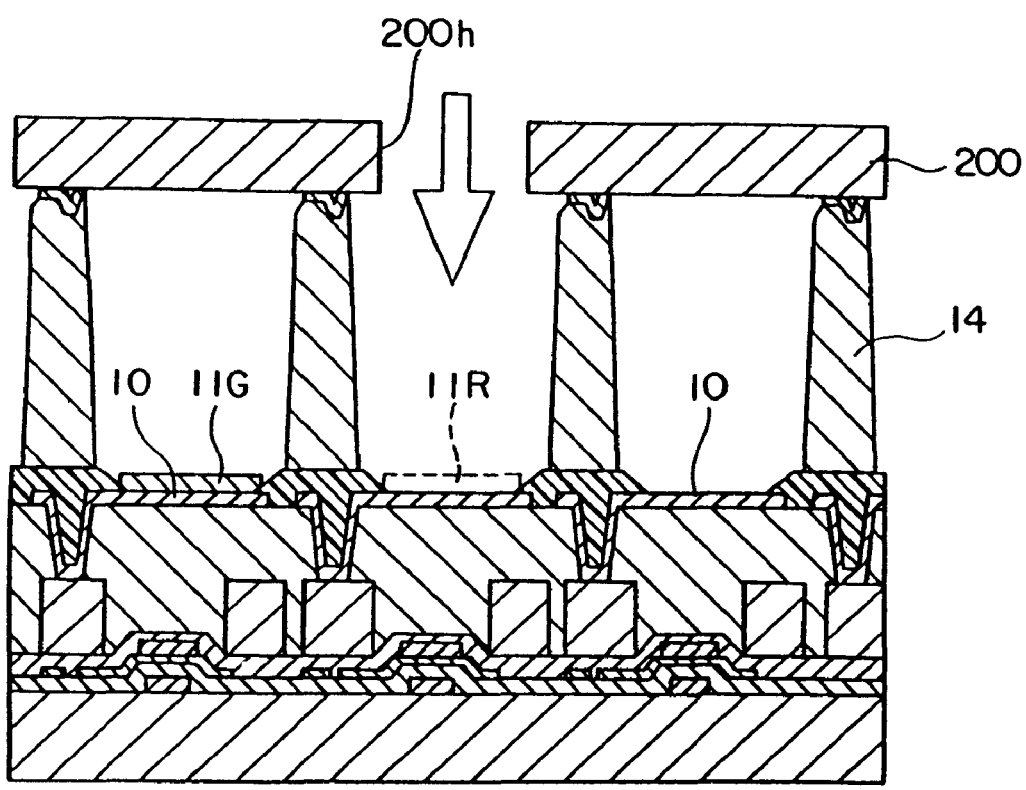
FIG. 21 is a view illustrating the alignment of a mask to a position of formation of an organic layer on a substrate.
Figure 22:
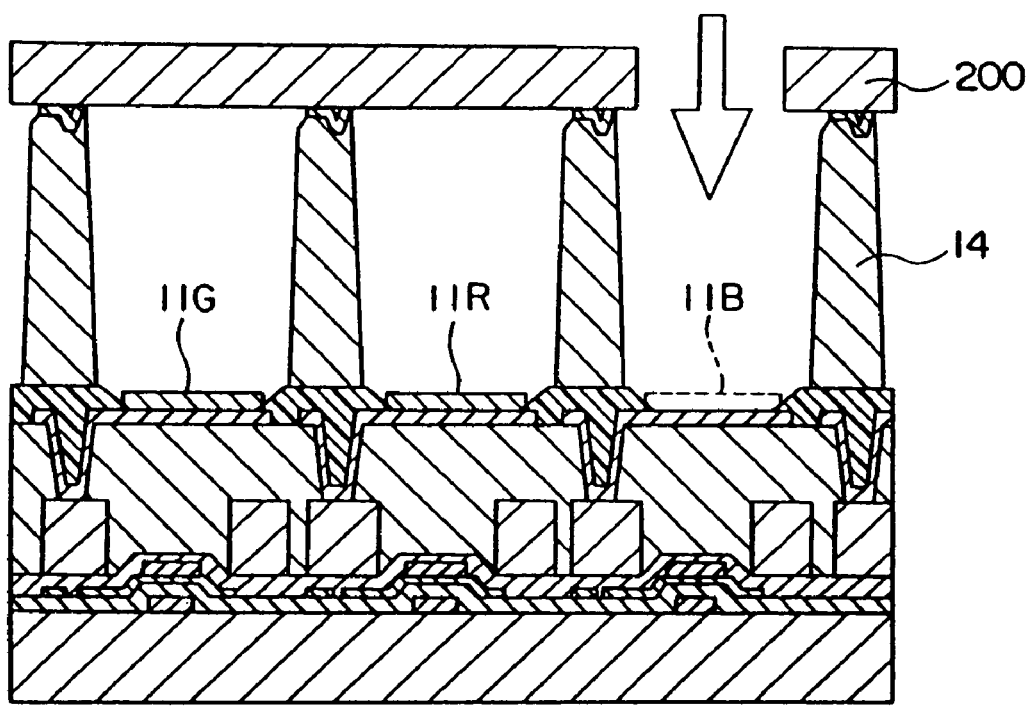
FIG. 22 is a view illustrating the alignment of a mask to a position of formation of an organic layer on a substrate.

In the alignment chamber 71, as shown in FIG. 21, an alignment is performed so that the opening 200h of the mask 200 is located at the position of formation of the organic layer 11R to be formed on the substrate 1.

After completing the alignment, the same procedure is used as in the operation explained with reference to FIG. 15 and FIG. 16 to reattach the substrate 1 and the mask 200 by the attachment fixture 100 and sequentially transfer the substrate 1 and the mask 200 in the attached state to the vapor deposition processing chambers 73, 74, and 75 to form the hole injection layer 11a, the hole transfer layer 11b, and the light emitting layer 11c of the organic layer 11R.

After forming the organic layer 11R, the attached substrate 1 and mask 200 are transferred into the alignment chamber 81 and, in the same way as the operation in the alignment chamber 71, the substrate 1 and the mask 200 are aligned and reattached by the attachment fixture 100.

In the alignment chamber 81, as shown in FIG. 21, alignment is performed so that the opening 200h of the mask 200 is located at the position of formation of the organic layer 11R to be formed on the substrate 1.

After completing the alignment, the same procedure is used as the operation explained with reference to FIG. 15 and FIG. 16 to reattach the substrate 1 and the mask 200 by the attachment fixture 100 and sequentially transfer the attached substrate 1 and the mask 200 to the vapor deposition processing chambers 83, 84, and 85 to form the hole injection layer 11a, the hole transfer layer 11b, and the light emitting layer 11c of the organic layer 11B.

After forming the organic layer 11B, the attached substrate 1 and the mask 200 are transferred to the electrode formation unit 90. In the electrode formation unit 90, the attached substrate 1 and mask 200 are first loaded into the substrate/mask separation chamber 93.

In the substrate/mask separation chamber 93, the attached substrate 1 and the mask 200 are separated. It should be noted that the substrate/mask separation chamber 93 is provided with the same alignment mechanism as the alignment chamber 81 or the like. By operating this alignment mechanism by a predetermined procedure, it becomes possible to separate the attachment fixture 100, the substrate 1, and the mask 200.

After separating the substrate 1 and the mask 200, the substrate 1 is transferred to the electrode formation chamber 94, while the attachment fixture 100 and the mask 200 are transferred to the fixture/mask unloading chamber 97.

In the electrode formation chamber 94, the cathode 12 is formed by vapor deposition. Specifically, by co-deposition of, for example, magnesium (Mg) and silver (Ag), a cathode electrode 12 made of a Mg—Ag alloy is formed. The film thickness is, for example, about 10 nm. Further, the ratio of the film formation speed between the Mg and Ag is about 9:1.

Next, after forming the cathode electrode 12 on the organic layers 11G, 11R, and 11B of the substrate 1, the substrate 1 is loaded into the sputtering chamber 95, then the transparent conductive layer 16 is formed on the cathode electrode 12. The film formation conditions are as follows: a sputtering gas of a mixed gas of, for example, argon (Ar) and oxygen (O2) (volume ratio of Ar/O2=1000), a pressure of about 0.3 Pa, and an output of the direct current sputtering apparatus of 40 W.

Next, after forming the transparent conductive film 16, the substrate 1 is loaded into the substrate unloading chamber 96. The substrate 1 transferred to the substrate unloading chamber 96 is unloaded from the substrate unloading chamber 96, then fixed to the substrate 18 via the ultraviolet cured resin layer 17. Thus, the assembly of the organic electroluminescence display is completed.

Further, the mask 200 and the attachment fixture 100 separated in the substrate/mask separation chamber 93 are transferred to the fixture/mask unloading chamber 97. The mask 200 and the attachment fixture 100 loaded to the fixture/mask unloading chamber 97 are unloaded from the fixture/mask unloading chamber 97, then reused.

It should be appreciated that by inspecting whether there is a defect in the mask 200 before being reused, it becomes possible to avoid reusing a mask 200 with a defect and prevent an inferior organic electroluminescence display from being manufactured.

As described above, according to an embodiment, by dividing the formation of the organic layers 11G, 11R, and 11B including the number of the organic material layers among different vapor deposition processing chambers, it is possible to suppress waste of the organic material used for vapor deposition.

Further, according to an embodiment, since the number of organic material layers are formed continuously in the state with the substrate 1 and the mask 200 aligned and attached, the time for the alignment in each of the vapor deposition processing chambers becomes unnecessary, so the cycle time can be shortened.

Furthermore, according to an embodiment, since no alignment mechanism is needed in each vapor deposition processing chamber, it becomes possible to reduce the equipment costs.

Furthermore, according to an embodiment, because of using the mask 200 for each substrate 1, it becomes possible to manufacture different types of organic electroluminescence displays in the same assembly line.

In the above described embodiments, a configuration where a single vapor deposition source is arranged in the vapor deposition chamber and only one organic material layer is formed in one vapor deposition chamber is employed, but it is also possible to employ a configuration where a number of vapor deposition sources are arranged in a vapor deposition chamber and a number of organic material layers are formed in one vapor deposition chamber.

For example, when there is an organic material layer taking an extremely long time to be formed, by arranging a single vapor deposition source for this organic material layer to form only this organic material layer taking a long time to be formed and arranging a number of vapor deposition sources for the other organic material layers taking a short time to be formed, it becomes possible to prevent the cycle time from being extended.

Furthermore, in the above described embodiments, explanation was given with reference to an organic layer including three stacked organic material layers, but by applying the present invention to an organic layer including more stacked organic material layers, a greater effect will be obtained from the viewpoint of productivity and the consumption of the organic materials.

Furthermore, in the above described embodiments, when the work in each chamber has no influence on the work in the other chambers, it is unnecessary to partition off the chambers by the gates Gt.

Further, the arrangement of the chambers is not limited to a cluster arrangement. It is possible to select from a straight arrangement, a U-shaped arrangement, or any other preferable or suitable arrangements in accordance with the order of work.

According to an embodiment of the present invention, it is possible to shorten the cycle time of the process for forming the organic layer of an organic electroluminescence display, so mass production of the organic electroluminescence display becomes possible.

Further, according to an embodiment of the present invention, it is possible to suppress waste of the organic materials used for forming the organic layer, so the costs of producing the organic electroluminescence display can be reduced.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. An apparatus for manufacturing an organic electroluminescence display, the organic electroluminescence display having a substrate, a first electrode layer formed on the substrate, an organic layer including a plurality of organic material layers stacked on the first electrode layer in a predetermined pattern and a second electrode layer formed on the organic layer, the apparatus comprising:
   a first alignment mechanism for aligning a mask, having openings corresponding to the predetermined pattern, to the substrate and for detachably attaching the mask and the substrate;
   a first formation unit including a plurality of vacuum processing chambers for sequentially forming the plurality of organic material layers on the substrate at a first color position with the substrate attached to the mask;
   a second alignment mechanism for changing the alignment between the substrate and the mask, and for detachably attaching the substrate and the mask again; and
   a second formation unit including a plurality of vacuum processing chambers for sequentially forming the plurality of organic material layers on the substrate at a second color position with the substrate attached to the mask,
   wherein each of the vacuum processing chambers correspond to each of the organic material layers, and
   wherein the second alignment mechanism is provided to connect the first formation unit and the second formation unit in series thereby providing flow-through processing.

2. An apparatus for manufacturing an organic electroluminescence display as claimed in claim 1, further comprising a vacuum transfer chamber connecting the vacuum processing chambers, wherein the transferring mechanism is arranged in the vacuum transfer chamber.

3. An apparatus for manufacturing an organic electroluminescence display as claimed in claim 1, further comprising an attachment fixture for attaching the substrate and the mask.

4. An apparatus for manufacturing an organic electroluminescence display as claimed in claim 3, wherein the mask is formed of a magnetic material, and the attachment fixture is provided with a contact surface fully contacting a non-film formation surface side of the substrate, has at least the contact surface formed of a plate-shaped magnet, and has the substrate sandwiched between the mask and the contact surface attached with the mask by a magnetic force of the magnet.

5. An apparatus for manufacturing an organic electroluminescence display as claimed in claim 3, wherein each of the vacuum processing chambers includes a fixture holder for holding the attachment fixture.

6. An apparatus for manufacturing an organic electroluminescence display as claimed in claim 1, the apparatus further comprising:
   a separating mechanism for separating the mask and the substrate after forming the second organic layer; and
   a vacuum chamber for forming the second electrode layer on the substrate separated from the mask so as to cover the first and second organic layers.

7. An apparatus for manufacturing an organic electroluminescence display as claimed in claim 1, wherein the first and second alignment mechanisms comprise a mask support member configured to support the mask, a substrate support member configured to support the substrate, an attachment fixture support member configured to support the attachment fixture, and a movement mechanism for changing relative positions between the mask support member, the substrate support member, and the attachment fixture support member, whereby the mask and the substrate are aligned, attached, or separated.

8. An apparatus for manufacturing an organic electroluminescence display as claimed in claim 1, further comprising a loading unit including a plurality of vacuum processing chambers, the plurality of vacuum processing chambers including the first alignment chamber, wherein the loading unit is connected in series with the first formation unit by a transfer chamber, thereby providing flow-through processing.

9. An apparatus for manufacturing an organic electroluminescence display as claimed in claim 1, further comprising:
- a third formation unit including a plurality of vacuum processing chambers for sequentially forming the organic material layers on the substrate at a third color position with the substrate attached to the mask; and
- a third alignment chamber connecting the second formation unit to the third formation unit;
- wherein the first formation unit, the second alignment chamber, the second formation unit, the third alignment chamber, and the third formation unit are connected in series.

10. An apparatus for manufacturing an organic electroluminescence display as claimed in claim 1, wherein each of the vacuum processing chambers includes a heating vessel holding an organic material for forming a layer on the substrate, wherein the layer is selected from the group consisting of: a hole injection layer, a hole transfer layer, a light emitting layer and an electric charge injection layer.

11. An apparatus for manufacturing an organic electroluminescence display, the organic electroluminescence display having a substrate, a first electrode layer formed on the substrate, an organic layer including a plurality of organic material layers stacked on the first electrode layer in a predetermined pattern and a second electrode layer formed on the organic layer, the apparatus comprising:
- a fixture loading chamber including an attachment fixture for attaching the substrate and the mask, the attachment fixture including a magnetic plate and grip portions connected to ends of the magnetic plate, the grip portions projecting outwardly from the ends of the magnetic plate;
- a first alignment mechanism for aligning a mask, having openings corresponding to the predetermined pattern, to the substrate and for detachably attaching the mask and the substrate;
- a first formation unit including a plurality of vacuum processing chambers for sequentially forming the plurality of organic material layers on the substrate at a first color position with the substrate attached to the mask;
- a second alignment mechanism for changing the alignment between the substrate and the mask, and for detachably attaching the substrate and the mask again; and
- a second formation unit including a plurality of vacuum processing chambers for sequentially forming the plurality of organic material layers on the substrate at a second color position with the substrate attached to the mask,
- wherein each of the vacuum processing chambers correspond to each of the organic material layers,
- wherein the second alignment mechanism is provided to connect the first formation unit and the second formation unit in series thereby providing flow-through processing,
- wherein each of the first and second formation units include at least one fixture holder, and
- wherein each of the first and second alignment mechanisms comprise
    - a mask support member connected to a first elevating mechanism and configured to support the mask,
    - a substrate support member connected to a second elevating mechanism and having a plurality of supports for supporting the substrate, the supports being arranged so as not to contact the mask support member when upper portions of the supports are elevated above upper portions of the substrate support member by at least one of the first and second elevating mechanisms,
    - a fixture holder attached to a third elevating mechanism and including holding portions, the fixture holder configured such that the grip portions of the attachment fixture rest on the holding portions of the fixture holder to suspend the attachment fixture therein, and
    - a controller for changing relative positions between the mask support member, the substrate support member, and the fixture holder, whereby the mask and the substrate are aligned, attached, or separated.

12. An apparatus for manufacturing an organic electroluminescence display as claimed in claim 11, the apparatus further comprising:
- a separating mechanism for separating the mask and the substrate after forming the second organic layer; and
- a vacuum chamber for forming the second electrode layer on the substrate separated from the mask so as to cover the first and second organic layers.

13. An apparatus for manufacturing an organic electroluminescence display as claimed in claim 11, further comprising a loading unit including a plurality of vacuum processing chambers, the plurality of vacuum processing chambers including the first alignment chamber, wherein the loading unit is connected in series with the first formation unit by a transfer chamber, thereby providing flow-through processing.

14. An apparatus for manufacturing an organic electroluminescence display as claimed in claim 11, further comprising:
- a third formation unit including a plurality of vacuum processing chambers for sequentially forming the organic material layers on the substrate at a third color position with the substrate attached to the mask; and
- a third alignment chamber connecting the second formation unit to the third formation unit;
- wherein the first formation unit, the second alignment chamber, the second formation unit, the third alignment chamber, and the third formation unit are connected in series.

15. An apparatus for manufacturing an organic electroluminescence display as claimed in claim 11, wherein each of the vacuum processing chambers includes a fixture holder.

* * * * *